(12) United States Patent
Lu

(10) Patent No.: US 7,008,802 B2
(45) Date of Patent: Mar. 7, 2006

(54) METHOD AND APPARATUS TO CORRECT WAFER DRIFT

(75) Inventor: Zhimin Lu, Mesa, AZ (US)

(73) Assignee: ASM America, Inc., Phoenix, AZ (US)

( * ) Notice: Subject to any disclaimer, the term of this patent is extended or adjusted under 35 U.S.C. 154(b) by 786 days.

(21) Appl. No.: 09/870,393

(22) Filed: May 29, 2001

(65) Prior Publication Data

US 2004/0151574 A1 Aug. 5, 2004

(51) Int. Cl.
*H01L 21/00* (2006.01)
*B65H 1/00* (2006.01)
*G01B 11/00* (2006.01)
*G01C 25/00* (2006.01)

(52) U.S. Cl. .................. 438/7; 414/936; 250/206.1; 356/622; 702/150

(58) Field of Classification Search ............ 438/5, 438/7, 14, 16; 250/252.1, 206, 206.1, 206.2, 250/578.1, 234–236; 700/121; 702/87, 94–95, 702/150; 414/816, 936; 356/614, 615, 622
See application file for complete search history.

(56) References Cited

U.S. PATENT DOCUMENTS

| 3,907,439 | A | 9/1975 | Zanoni |
| 3,945,505 | A | 3/1976 | Frisbie et al. |
| 4,024,944 | A | 5/1977 | Adams et al. |

(Continued)

FOREIGN PATENT DOCUMENTS

| EP | 0 282 233 A1 | 9/1988 |
| EP | 0 313 466 A2 | 4/1989 |
| EP | 0 597 637 A1 | 5/1994 |
| JP | 58-055270 | 4/1983 |
| JP | 61-087352 | 5/1986 |
| JP | 61-184842 | 8/1986 |
| JP | 61-228639 | 10/1986 |
| JP | 62-073643 | 4/1987 |
| JP | 11-347975 | 12/1999 |
| WO | WO 99/52686 | 10/1999 |

OTHER PUBLICATIONS

Kurt Petersen et al., "High–Performance Mass–Flow Sensor with Integrated Laminar Flow Micro–Channels," *International Conference on Solid State Sensors and Actuators—Digest of Technical Papers* (1985), pp. 361–363.

GCA Corporation, (Wafertrac1006 Advertisement), *Solid State Technology*, vol. 28, No. 1, (Jan. 1985), p. 3.

Brooks Automation, (Wafer Handling Robot), *Solid State Technology*, vol. 28, No. 1, (Jan. 1985), p. 74.

Zbigniew M. Wojcik, "A Method of Automatic Centering of Chips, Masks and Semiconductor Wafers," *Electron Technology*, (1977), vol. 10, No. 3, pp. 79–96.

IBM Technical Disclosure Bulletin, "Automatic Mask/Wafer Alignment System," (Sep. 1985), vol. 28, No. 4, pp. 1474–1479.

IBM Technical Disclosure Bulletin, "Vacuum–Compatible Low Contamination Wafer–Orientor System," (Feb. 1986), vol. 28, No. 9, pp. 4056–4058.

(Continued)

*Primary Examiner*—Evan Pert
(74) *Attorney, Agent, or Firm*—Knobbe, Martens, Olson & Bear, LLP

(57) ABSTRACT

A method and apparatus is provided for determining workpiece drift from its nominal or intended position. The apparatus includes two proportionate sensors, each of which gives an output reading that depends upon how much of the sensor beam is blocked by an edge of the workpiece. A computer can calculate positional drift based upon these readings. Also disclosed is a method for aligning proportionate sensors to be parallel to one another.

45 Claims, 12 Drawing Sheets

U.S. PATENT DOCUMENTS

| | | | |
|---|---|---|---|
| 4,148,344 A | 4/1979 | Critchell et al. |
| 4,201,378 A | 5/1980 | Hams |
| 4,228,886 A | 10/1980 | Moran |
| 4,449,885 A | 5/1984 | Hertel et al. |
| 4,457,664 A | 7/1984 | Judell et al. |
| 4,466,073 A | 8/1984 | Boyan et al. |
| 4,507,078 A | 3/1985 | Tam et al. |
| 4,523,985 A | 6/1985 | Dimock |
| 4,559,451 A | 12/1985 | Curl |
| 4,635,373 A | 1/1987 | Miyazaki et al. |
| 4,647,268 A | 3/1987 | Scholl |
| 4,698,511 A | 10/1987 | Sueda et al. |
| 4,705,951 A | 11/1987 | Layman et al. |
| 4,720,635 A | 1/1988 | Uga |
| 4,744,713 A | 5/1988 | Hrovath |
| 4,765,793 A | 8/1988 | Goddeau |
| 4,770,590 A | 9/1988 | Hugues et al. |
| 4,789,294 A | 12/1988 | Sato et al. |
| 4,818,169 A | 4/1989 | Schram et al. |
| 4,819,167 A | 4/1989 | Cheng et al. |
| 4,833,790 A | 5/1989 | Spencer et al. |
| 4,838,733 A | 6/1989 | Katz |
| 4,880,348 A | 11/1989 | Baker et al. |
| 4,907,035 A | 3/1990 | Galburt et al. |
| 5,044,752 A | 9/1991 | Thurfjell et al. |
| 5,162,642 A | 11/1992 | Akamatsu et al. |
| 5,194,743 A | 3/1993 | Aoyama et al. |
| 5,239,182 A | 8/1993 | Tateyama et al. |
| 5,483,138 A | 1/1996 | Shmookler et al. |
| 5,563,798 A | 10/1996 | Berken et al. |
| 5,706,201 A | 1/1998 | Andrews |
| 5,706,930 A | 1/1998 | Sahoda et al. |
| 5,740,062 A | 4/1998 | Berken et al. |
| 5,768,125 A | 6/1998 | Zinger et al. |
| 5,822,213 A | 10/1998 | Huynh |
| 5,870,488 A | 2/1999 | Rush et al. |
| 5,900,737 A | 5/1999 | Graham et al. |
| 5,905,850 A | 5/1999 | Kaveh |
| 5,917,601 A | 6/1999 | Shimazaki et al. |
| 5,980,194 A | 11/1999 | Freerks et al. |
| 6,198,976 B1 | 3/2001 | Sundar et al. |
| 6,327,517 B1 | 12/2001 | Sundar |
| 6,502,054 B1 * | 12/2002 | Mooring et al. ............ 702/150 |
| 6,690,986 B1 * | 2/2004 | Mitchell et al. ............ 700/112 |

OTHER PUBLICATIONS

IBM Technical Disclosure Bulletin, "No–Edge Contact Wafer Orientor," (Jan. 1975), vol. 17, No. 8, pp. 2220–2221.

IBM Technical Disclosure Bulletin, "Front Wafer Registration Device for Batch Process Etch End–Pint Detection System," (Oct. 1977), vol. 20, No. 5, pp. 1756–1759.

Kimiyoshi Deguchi et al., " Alignment Accuracy Evaluation of X–Ray Lithography System SR–1," *Journal of the Japan Society of Precision Engineering*, (1985), vol. 51, No. 5, pp. 156–162.

ASM Europe, (Advance 400 Course Module 19), Rev. C, (Jun. 1999).

Keyence Corporation Brochure, "Laser Thrubeam Photoelectric Sensors LX2 Series," (date unknown).

* cited by examiner

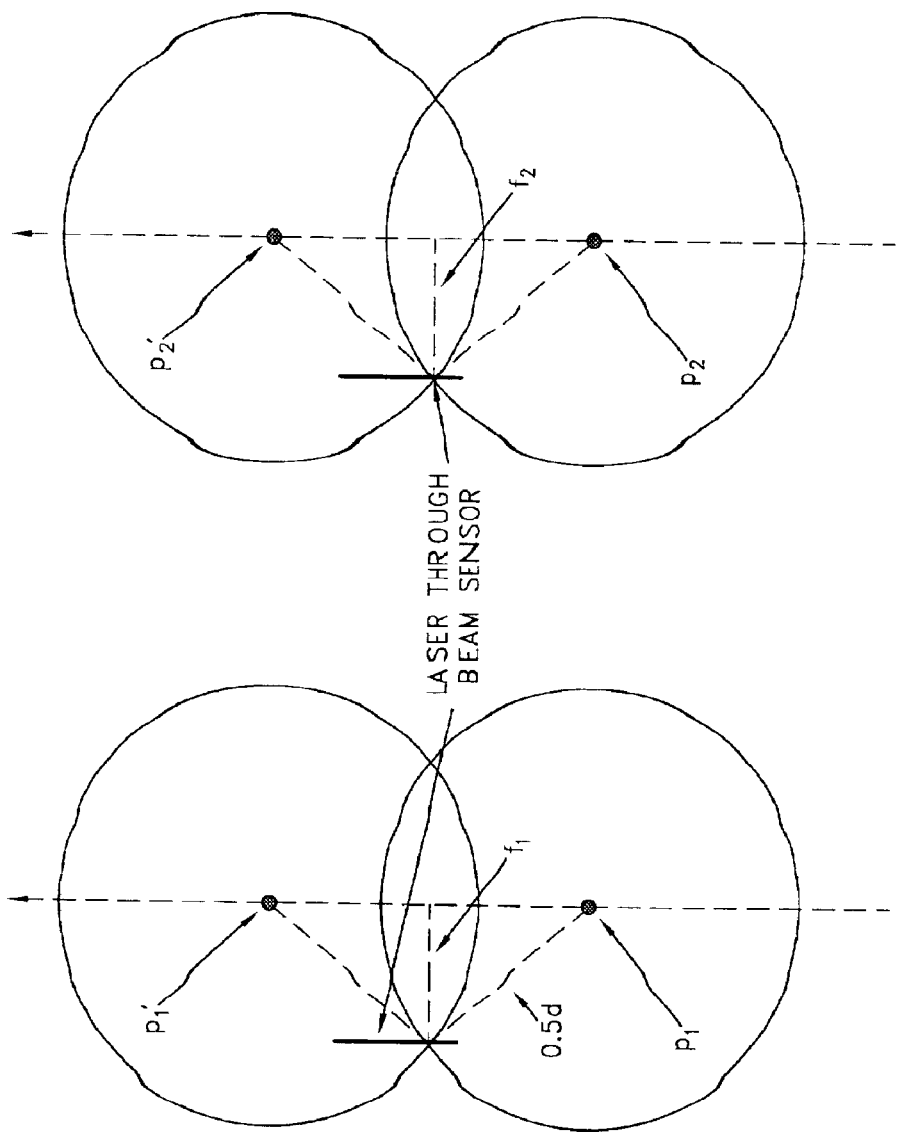

Method and Apparatus to Correct Wafer Drift

BACKGROUND OF THE INVENTION

1. Field of the Invention

This invention relates generally to correcting positional change (drift) of a workpiece from a nominal position, and more particularly to setting up an apparatus and using the apparatus to detect and correct substrate drift in a semiconductor processing system.

2. Description of the Related Art

A robot is commonly used to transport a substrate, such as a silicon wafer, from one location to another in semiconductor processing equipment. For example, wafers must be transported from a storage cassette and a wafer holder inside the processing chamber. The robot includes an end effector to pick up the wafer from the cassette, transfer and place the wafer into the processing chamber and then transfer the wafer back into its storage cassette after processing is complete.

The wafer must often be placed with great accuracy. A typical wafer 10 and a susceptor 12 for holding the wafer within a single-wafer processing chamber are shown in the diagram in FIG. 1. For a wafer with a diameter of 200 mm, the pocket on the susceptor, into which the wafer fits, has a diameter only slightly larger, such as 201 mm. There is a very small clearance 14, only 0.5 mm in the illustrated case, between the edge of the wafer 10 and the edge of the susceptor pocket. It is important that the wafer be centered in the pocket and not touch the sidewalls thereof. If the wafer has contact with the sidewalls of the pocket, local temperature changes occur, resulting in temperature gradients across the wafer. This can cause non-uniformity in process results, as most semiconductor processing depends critically on temperature. Similarly, uncentered wafers can be damaged during placement in a number of different handling situations.

The wafer does not normally change position with respect to the end effector during wafer transport. Errors in final placement of the wafer, known as "wafer drift," are due mainly to variations in wafer position in the cassette at pickup, i.e., the end effector attaches to each wafer at a slightly different location. Therefore it is necessary to correct the position of the wafer before it is placed onto the wafer holder.

Often standalone stations are established for locating the center of a wafer before being picked up again by the robot, such that centered placement on the robot end effector is assured. Unfortunately, such systems require separate drop-off and pick-up operations which consume valuable processing time. It is therefore advantageous to correct the wafer's position "in line" or en route. One way this correction is made is by altering the drop-off point for the wafer transfer robot based on measurements of the wafer position after it is removed from the cassette.

In the prior art, there are many ways to measure the position of the wafer on the robot before the wafer is placed on the susceptor or other destination. It is desirable to avoid contact with the wafer, so optical systems are widely used. A light beam is shone onto a wafer, and sensors detect either a reflected beam or a portion of a transmitted beam when the robot is at a known position. Sensor data is used to determine the wafer position.

Most methods used to to correct the wafer position are based on optical through beam sensors that generate an ON/OFF switching output signal. A typical ON/OFF type optical sensor consists of a transmitter and a receiver. The transmitter generates an optical ray (which may be within the visible spectrum), which is picked up by a receiver. If the beam is blocked by an object between the transmitter and the receiver, such as a wafer, the output signal state of the sensor changes, for example from OFF to ON. Most of these sensors are made with lasers. In systems for measuring wafer position, when a wafer edge crosses the beam path, the sensor state changes and a register is triggered to record the wafer's position. Since the change in sensor state is synchronized with the recording of the wafer position, it is possible to determine the position of the wafer based on the time of wafer state change, the speed of robot movement, and the recording of the robot position. The actual wafer position is thus calculated and the subsequent placement operation uses this actual wafer position.

The accuracy of the optical measurements depends, in part, on how well the position of these optical components are known. Currently, these systems are positioned using mechanical means, which are not always accurate. Moreover, typical in line wafer centering systems are rather complex and require many sensors accurately positioned.

A need exists for a simple and reliable system for properly positioning workpieces, such as wafer, in robotic transfer.

SUMMARY OF THE INVENTION

In satisfaction of this need, the present invention provides a system and method for determining an amount of a workpiece's drift from its intended position and for correcting the same prior to placement at a destination. Furthermore, the present invention provides a method for setting up and calibrating an optical system particularly useful for the positioning method.

In accordance with one aspect of the invention, a method is provided for accurately positioning a substrate within a semiconductor processing apparatus. The method includes loading a reference substrate onto a robot and moving the robot with the reference substrate to a nominal robot position at a positioning station. Reference substrate data is recorded from a sensor at the positioning station while the robot is at the nominal robot position. A process substrate is loaded onto the robot, and the robot is moved with the process substrate to the nominal robot position at the positioning station. Process substrate data is recorded from the sensor, relating to the process substrate at the positioning station. Drift of the process substrate relative to the reference substrate is calculated. In subsequent robot movement of the process substrate, compensation is made for this calculated drift.

In accordance with another aspect of the invention, a system is provided for accurately positioning a workpiece during movement thereof. The system includes a positioning station that, in turn, includes at least two proportionate sensors aligned parallel to one another. Each sensor produces an output inversely proportional to a sensor beam area blocked by the workpiece. The system also includes a computer that instructs a robot to move the workpiece into a position at the positioning station where at least two of the sensors have their sensor beams partially blocked by an edge of the workpiece. The computer is additionally programmed to read outputs from the sensors, calculate a positional drift relative to an expected workpiece position, and adjust a robot position to compensate for the positional drift.

In accordance with another aspect of the invention, a method is provided for orienting at least one sensor for determining a position of a substrate. The method includes placing a sensor within a processing system in an initial orientation. The substrate is moved to a plurality of substrate positions and data is collected from the sensor at the plurality of substrate positions. The sensor is then adjusted from the initial orientation based upon the data collected by sensor. In the illustrated embodiment, this process is used to ensure that each of a plurality of sensors is aligned parallel to a direction of substrate translation during the orientation process, and thus each of the sensors are aligned parallel to one another.

DETAILED DESCRIPTION OF THE PREFERRED EMBODIMENT

The method and apparatus to correct wafer drift of the present invention will now be described with respect to preferred embodiments; however, the method and apparatus of the present invention are not limited to the illustrated tool. Rather, the method and apparatus may be used in any tool or environment in which it is necessary to place a workpiece in a position with a high degree of accuracy. Moreover, the skilled artisan will readily appreciate that the formulas and specific sequences of operation described herein are merely exemplary and that variations can be made without departing from the spirit and scope of the invention.

Exemplary Process Tool

Figure 1:
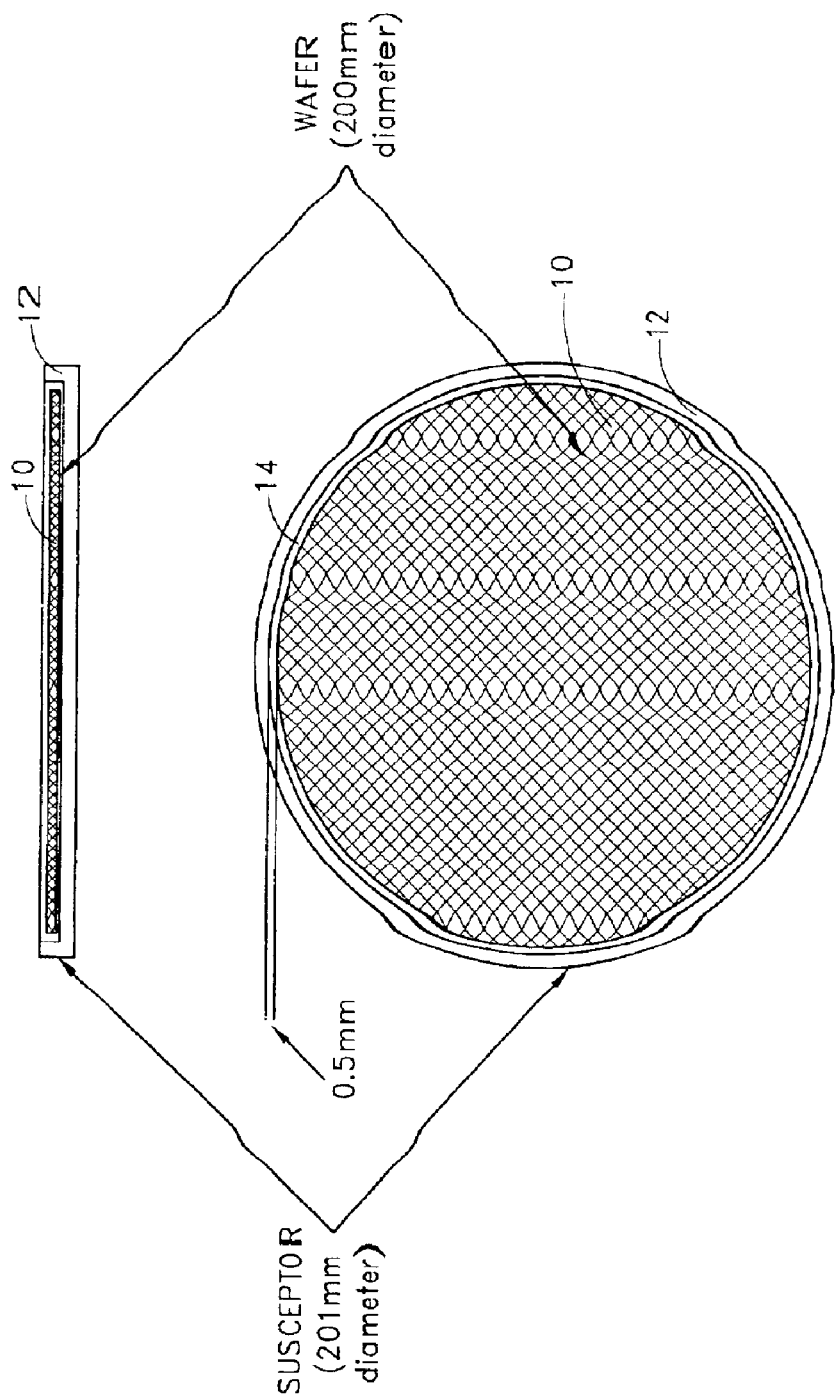
FIG. 1 is a schematic diagram showing a 200 mm wafer in place in the pocket of a wafer holder or susceptor in both top and cross-section views.
Figure 2A:
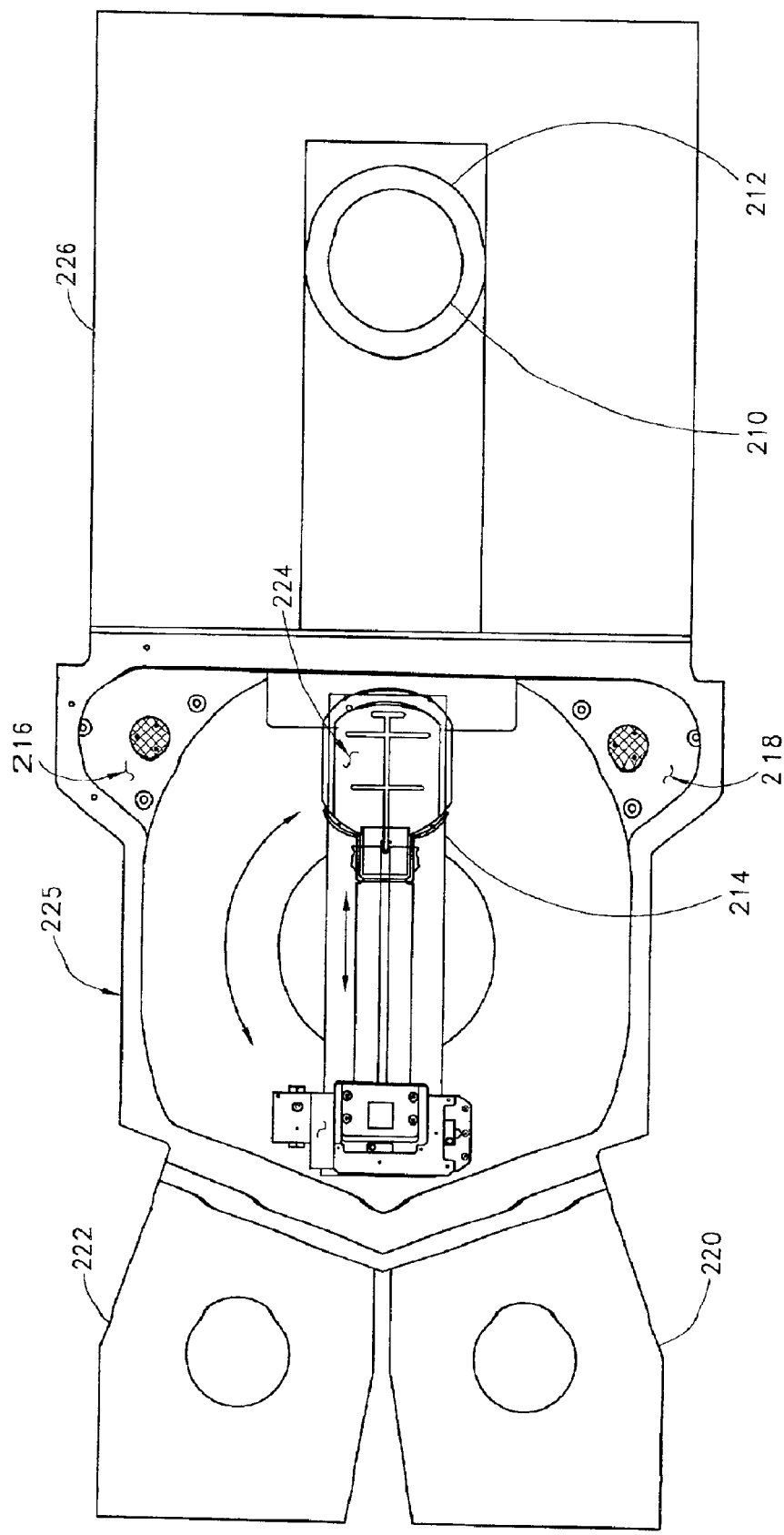
FIG. 2A is a plan view of an example of a semiconductor manufacturing tool in which the method of the present invention is employed.

An exemplary wafer processing tool is depicted in FIG. 2A. Wafers 210 are transferred by a robot 214 from load lock chambers 220, 222. The robot 214 includes an end effector 224, which can take the form a paddle, fork, Bernoulli wand, suction device, gripper, etc. In the illustrated embodiment, the robot 214 is located in a wafer handling or transfer chamber 225 between the load lock chambers 220, 222 and a process chamber 226, and includes two end effectors. A first end effector comprises a paddle for transfer from or to the cassettes and a second end effector comprises a fork or Bernoulli wand for transfer from or to the hot process chamber. Wafers 210 are moved among a wafer support or susceptor 212 (within the process chamber 226), cool down stations 216, 218 and the load lock chambers 220, 222 in accordance with a preferred order of operations to be described below. Wafer processing is conducted on susceptor 212 within reaction chamber 226. Wafer staging (before processing) and cool down (after processing) are conducted at the cool down stations 216 and 218. In the exemplary tool, correction for drift is preferably performed in the wafer handling chamber 225, between the load lock chambers 220, 222 and the cool down stations 216, 218, preferably near the cool down stations 216, 218.

Figure 2B:
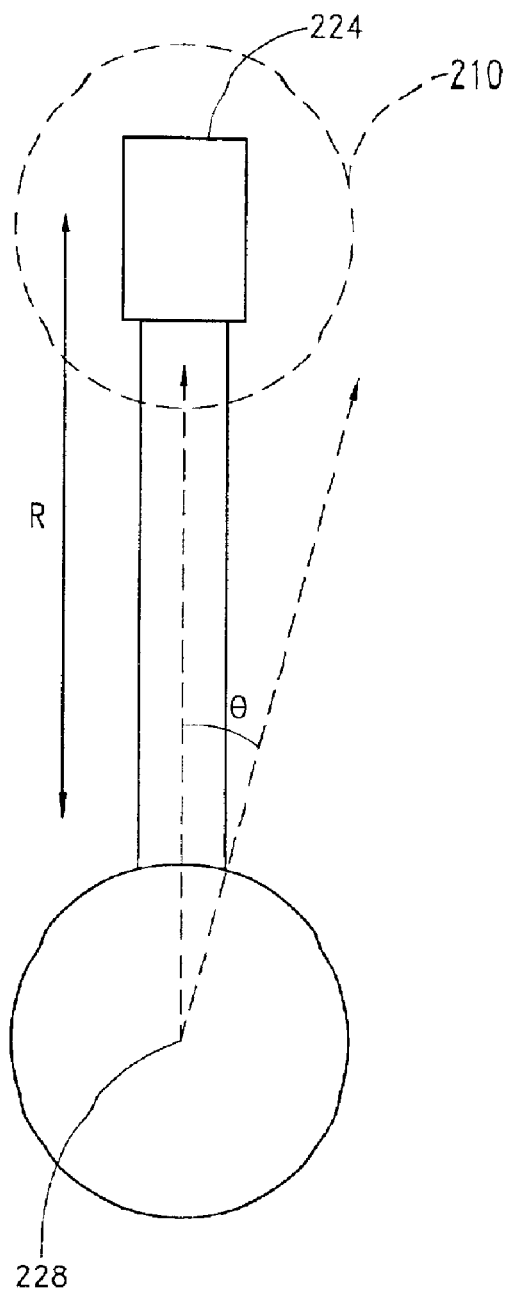
FIG. 2B is a plan view showing the robot of the semiconductor manufacturing tool, illustrating the end effector positioning parameters R and θ.

FIG. 2B shows a schematic view of the robot 214 of this processing tool. A wafer 210 is held by the end effector 224 while the robot arm is extended or retracted. Parameter R represents the extent of extension/retraction of the end effector 224 relative to a robot origin 228. Parameter θ represents the angle formed by the robot arm as it rotates. Another parameter z represents vertical movement (not shown). The method and apparatus of this embodiment are described in the context of the preferred robot and coordinate system, illustrating compensation for wafer drift from a nominal wafer position (described below) by adjusting the movement of the wafer along the direction of translation R and the angle of deviation θ. The skilled artisan will appreciate, however, that the principles and advantages described herein are readily applicable to alternative coordinate systems.

Figure 2C:
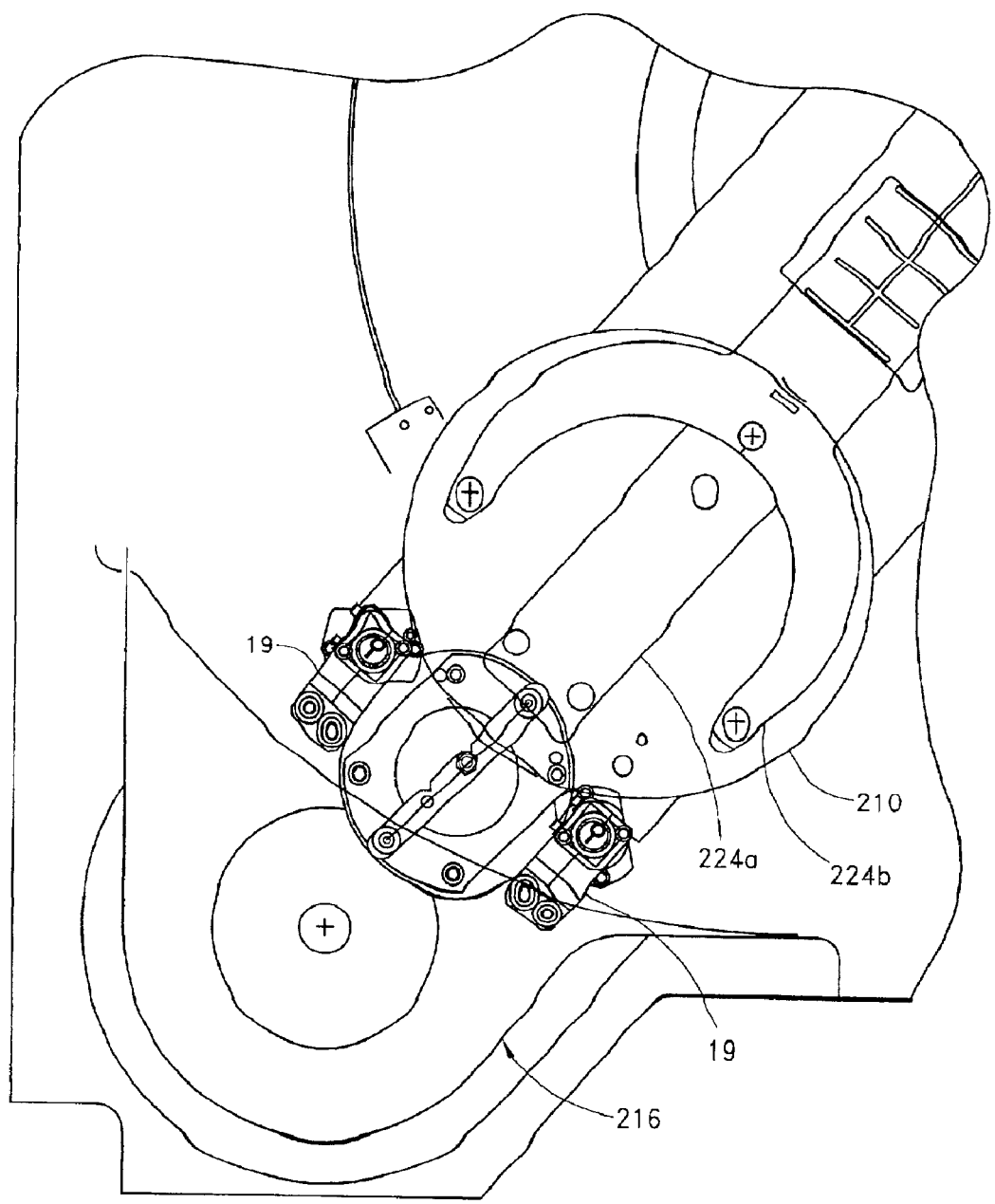
FIG. 2C is an enlarged plan view of one of the cooling stations of FIG. 2A having a centering station established nearby and a robot end effector approaching the centering station with a wafer thereon.

FIG. 2C illustrates a preferred location for the sensor system, proximate the cooling station 216. Two proportionate sensor systems 19 (described in more detail below) are placed in line with the robot movement toward/away from the cooling station 216, viewed from beneath the wafer 210. A robot is shown approaching a positioning station with the wafer 210 directly in front of and en route to the cooling station 216. For purposes of illustration, both a paddle 224a and a fork 224b are shown under the wafer 210. It will be understood that the paddle 224a is generally employed while transferring the wafer 210 between the load lock chambers 220, 222 and the cooling stations 216, 218, while the fork 224b is employed while transferring between the cooling stations 216, 218 and the process chamber 226.

Exemplary Sequence of Transfer

Figure 3:
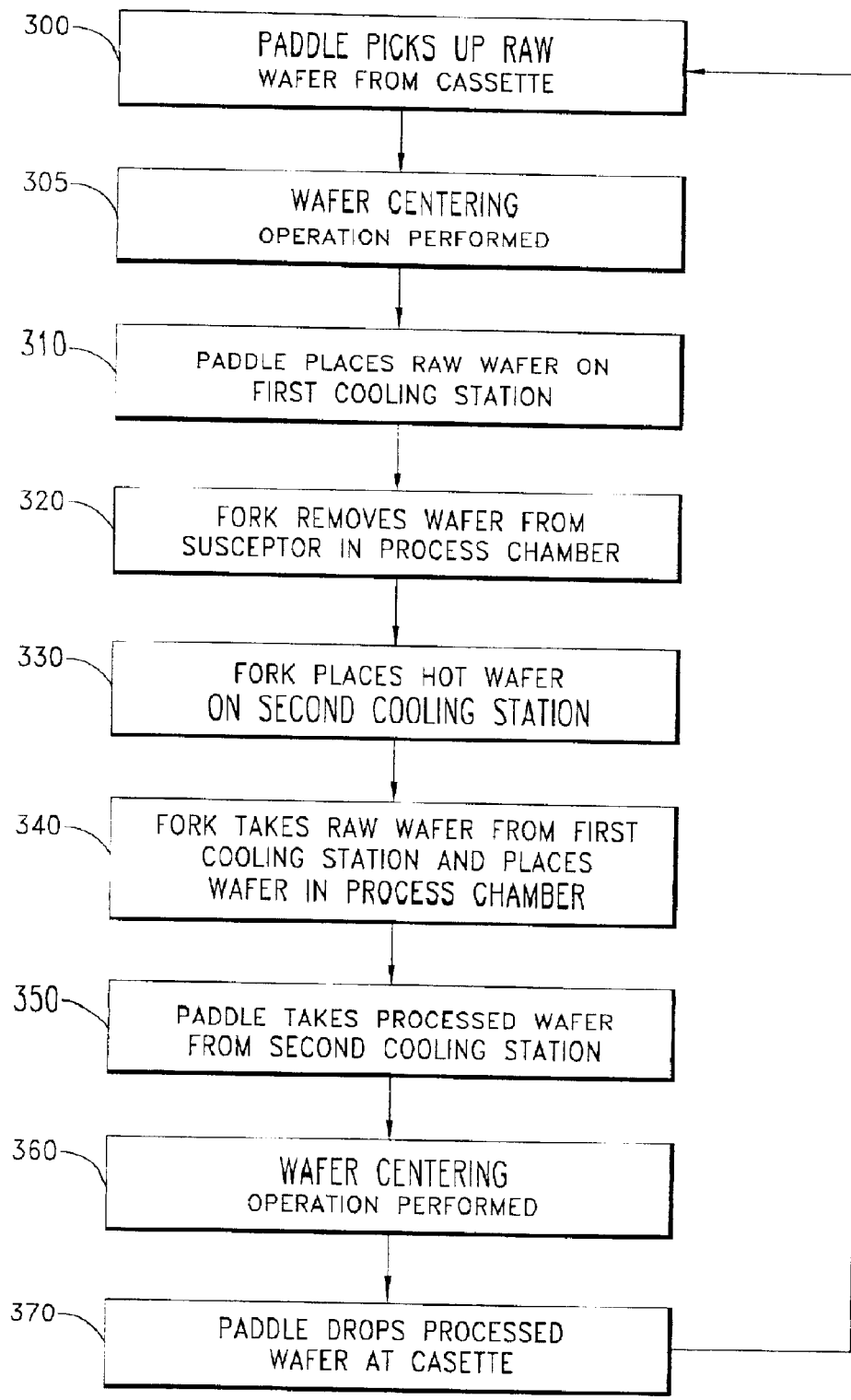
FIG. 3 is a flow chart showing a wafer transfer sequence in accordance with a preferred embodiment of the present invention.

The preferred sequence of operations of the tool described above is shown in the flowchart of FIG. 3. Reference is also made herein to the exemplary processing tool of FIG. 2A. The sequence illustrated by the flowchart presumes that a wafer is present on the susceptor in the reaction chamber when the sequence of the flowchart is initiated. First, as shown in step 300, the paddle of the robot picks up a raw (unprocessed) wafer from a cassette in one of the load lock chambers 220, 222. Next, the wafer is moved through the wafer handling chamber and a wafer centering operation is performed, as shown in step 305. Centering (or more generally positioning) is described in more detail below with respect to FIG. 11 below.

In step 310, the paddle places the centered wafer on the first cool down station 216, which serves as a staging area in the described sequence. The end effector 224 is employed to remove a heated wafer from within the reaction chamber (step 320) and moves the wafer to the other cool down station 218 (step 330). Note that, as illustrated in FIG. 2C, the robot preferably includes two end effectors: one for extending into the cassettes and a second one for reaching into the hot process chamber 226. In a commercial embodiment, a paddle is used for centering or positioning in accordance with the present disclosure and for transactions with the cassettes in the load lock chambers, while a fork or a Bernoulli wand is configured for transactions with the susceptor. When the sequence of operations is initiated with no wafer present in the reaction chamber, steps 320 and 330 are of course not necessary until a wafer has been moved to the reaction chamber.

Next, the end effector 224 moves to the first cool down station 216, where it picks up the raw wafer left by the paddle in step 310, and then moves the wafer onto the susceptor 212 in the reaction chamber 226 (step 340). The paddle of the robot then removes the processed wafer from cooling station 218 (step 350) and another centering or positioning operation (step 360) is performed prior to and placing the wafer in a cassette within the other load lock chamber 220 (step 370). At this point, a cycle has been completed; as at the beginning of the cycle, a wafer is in the reaction chamber. Thus, as at the beginning of the cycle, the paddle picks up a raw wafer from load-lock 222 (step 300), the wafer centering or positioning operation is again performed (step 305), and the centered raw wafer is placed on cooling station 216 (step 310).

As noted above, a centering step is preferably carried out prior to placing the raw wafer on the cool down or staging station 216. Thus, the sensors used in the centering step are preferably placed in the vicinity of cool down station 216. Another set of sensors can also be placed at the other cool down station 218 for centering prior to taking a processed wafer back to the load lock cassettes. However, these are only examples, and the centering step may be conducted at other locations. The skilled artisan will appreciate that the centering operation may be conducted in other process tools and at other stages of a processing sequence. For example, centering may be conducted just prior to placing the wafer into the reaction chamber. In a batch processing system, centering may be useful during loading of a wafer boat prior to processing. The details of the placement and orientation of the sensors in the exemplary reaction chamber are described below.

Preferred Proportionate Sensor System

Figure 4:
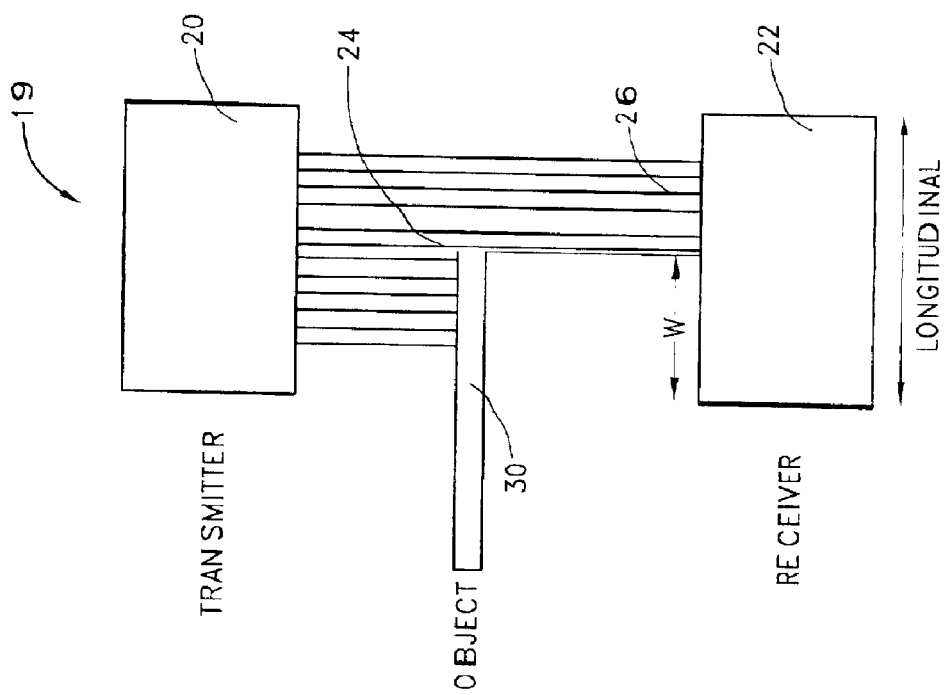
FIG. 4 is a schematic drawing showing a side view of a proportionate sensor, utilized in the preferred methods, when the laser beam of the transmitter is partially intercepted.

FIG. 4 shows an exemplary proportionate sensor 19 for use in the drift calculation and compensation method. Such proportionate sensors are available from companies such as Keyence Corp of Japan, LMI of Canada, Panasonic of Japan, etc., and can be referred to as laser through beam sensor (LTBS) systems. Each sensor 19 includes a transmitter 20 and a receiver 22. The transmitter 20 includes a laser which shines a ribbon-like beam 24, and the receiver sensor 22 produces a voltage characteristic of the amount of light 26 that reaches it. The voltage response is linear and inversely proportional to the area of the laser beam 24 that is blocked by the edge of a workpiece 30, such as the silicon wafer shown in FIG. 6. The voltage measurements and various known constants are then used in the preferred positioning operation to calculate the position of the wafer, described below with respect to FIG. 11. The present embodiment employs LX2-10 sensors produced by Keyence Corp., which have dimensions of 10 mm by 1 mm; however, this is only an example, and proportionate sensors of different sizes may be employed.

Figure 5:
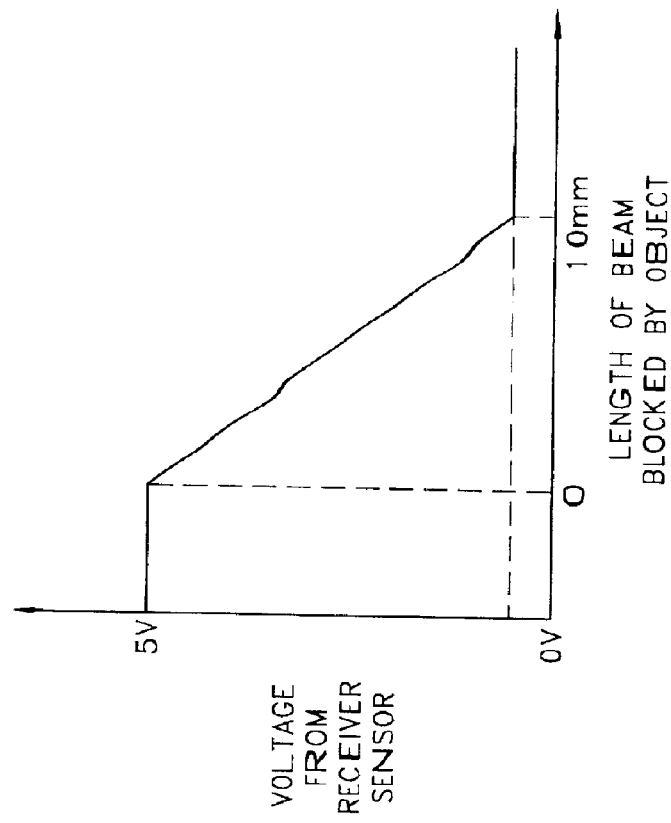
FIG. 5 is a graph that shows the analog voltage response of the proportionate sensor of FIG. 4 as a function of longitudinal length of laser beam intercepted.

FIG. 5 shows the voltage response of the receiver sensor as a function of the area of the laser beam blocked by the wafer. For purposes of the calculations herein, it is assumed that the area is proportionate to the length of the beam blocked, and the effect of a non-perpendicular object edge (such as a round wafer) intercepting a different area than a perpendicular edge is ignored. Accordingly, the lateral width of the beam is ignored for purposes of the calculations herein. When the entire laser beam reaches the receiver, the sensor gives its maximum voltage output (5 volts for the exemplary sensor). The voltage decreases linearly as the laser beam interception increases. When the beam is completely blocked and no light reaches the receiver, the voltage is zero.

Thus, when an object 30 partially blocks the beam, if the location of the sensor 19 is known, it is possible to determine the location of the object edge by measuring the voltage output. An output of 0 indicates that the entire beam is eclipsed; an output of 5 indicates that the edge has not intercepted the beam; an output of 2.5 volts (half the maximum output) indicates that the edge is located 5 mm (half the beam length) from the front end of the beam; an output of 3.0 volts indicates that the edge is located 6 mm from the front end of the beam; etc.

Figure 6:
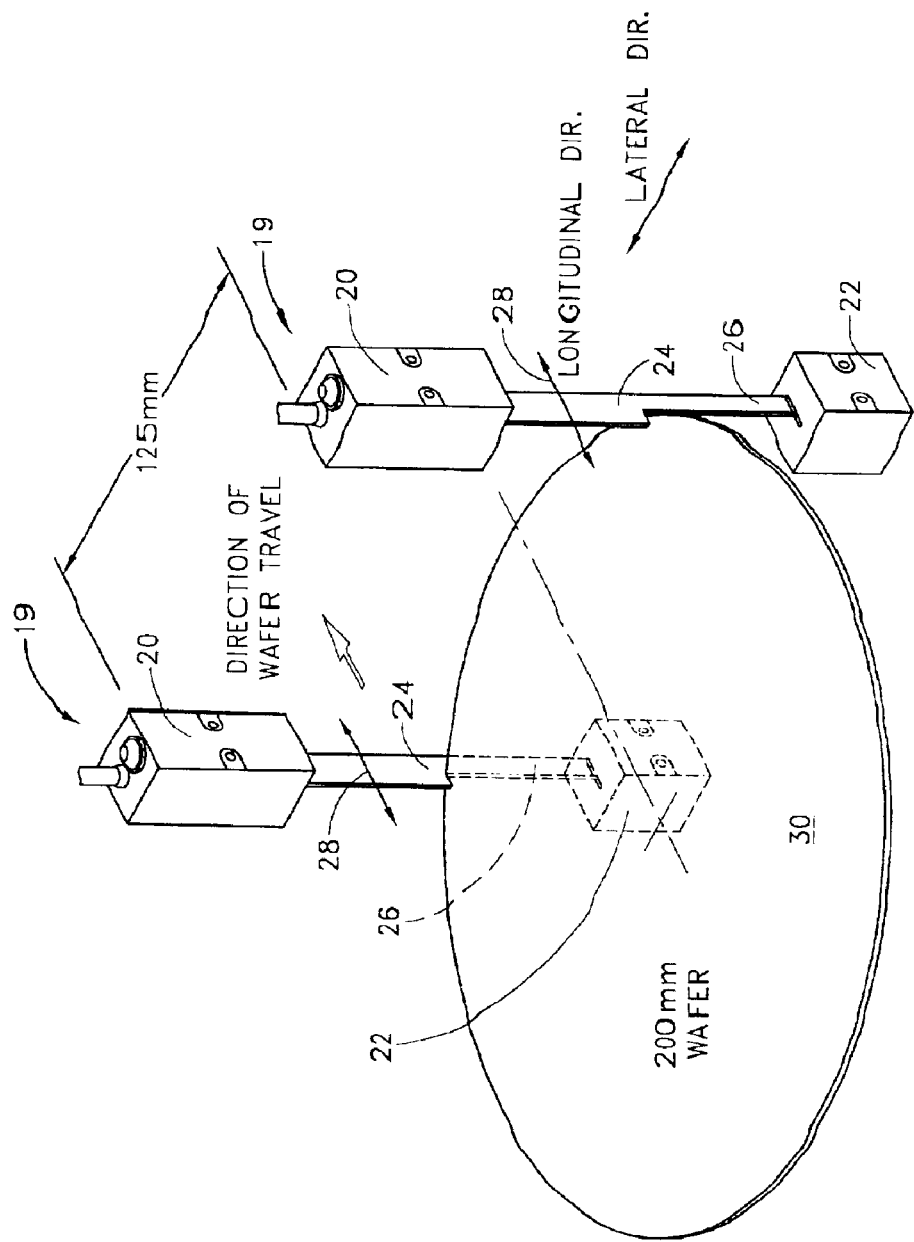
FIG. 6 is a schematic drawing showing two proportionate sensor systems arranged to detect two points at the front edge of a wafer in a centering station, according to a preferred embodiment of the present invention.

A preferred arrangement of two such sensors 19 is shown in FIG. 6. Each sensor 19 comprises a transmitter 20 that transmits a ribbon-like laser beam 24 in the direction of a receiver 22. The laser beam is oriented with its long dimension (10 mm in the illustrated embodiment) along a longitudinal direction 28, which coincides with the desired line of robot translation in normal operation. As discussed below, the robot can deviate from this translation direction during operation. The two sensors 19 are installed such that the edge of a silicon wafer 30 at a wafer centering station partially intercepts the laser beams 24 at some point along the wafer trajectory while carried by the robot end effector. At that point, only unblocked portions 26 of the transmitted laser beams 24 reach the receivers 22. The centering or positioning mechanism uses the readings of the sensors 19, compares these readings to readings expected if the wafer 30 had been properly positioned on the robot end effector, and the difference is used to adjust the wafer position prior to placement at its next destination. As noted, the preferred position drift calculation and adjustment process is discussed below in more detail with respect to FIG. 11.

System Set-Up, Including Sensor Alignment

Simple though the positioning method described herein is, its accuracy is based on an important assumption, that the axes of two optical sensors are parallel to each other and to the robot's translation axis. These sensors can installed on the tool housing using mechanical fixtures to make the planes of cases housing each LTBS system parallel to one another and to a best guess for the translation axis of the robot. In order to improve the accuracy of measurements made with these systems, the present invention provides a method of simply and accurately ensuring that the long axes of the laser beams and the normal translation direction of the wafer robot are all parallel using the sensors themselves.

Figure 7:
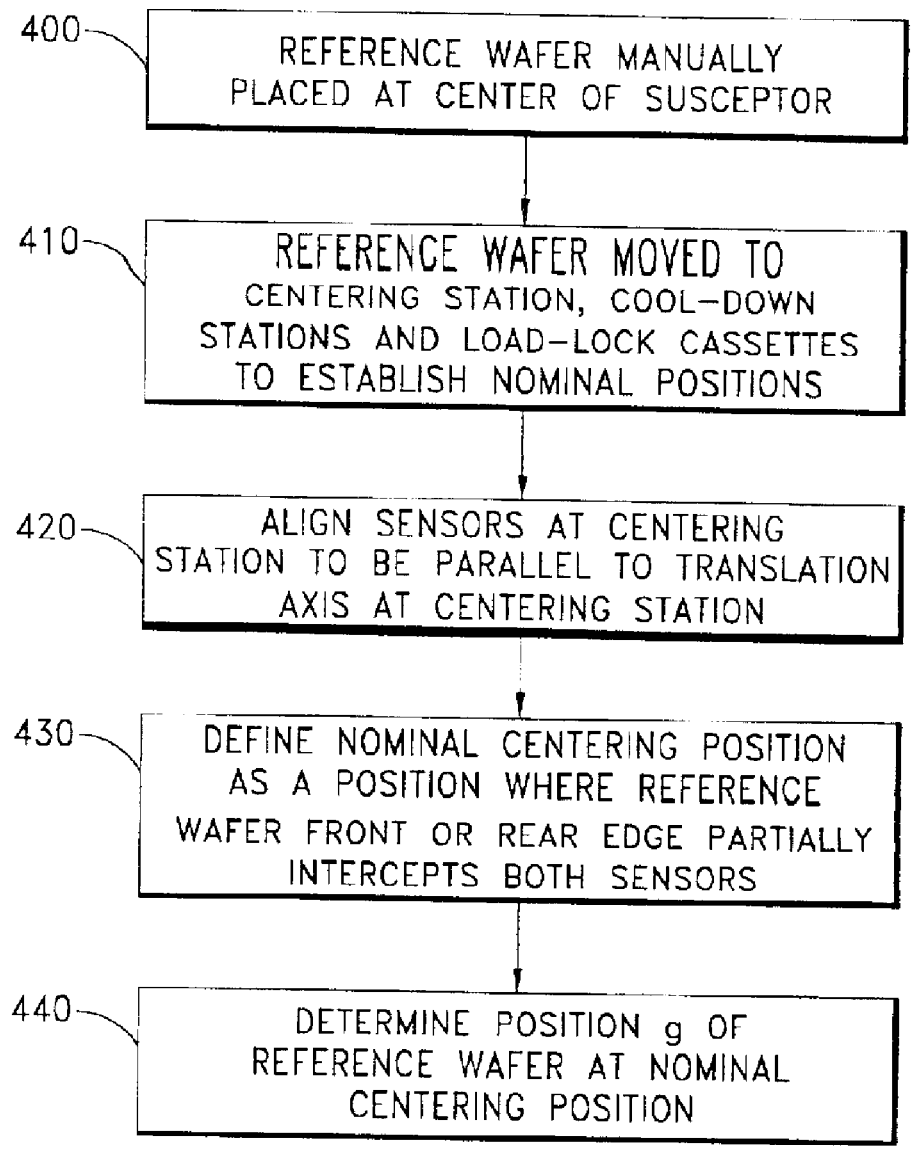
FIG. 7 is a flow chart showing a preferred process for setting up the sensor system of FIG. 6.

FIG. 7 is a flow chart illustrating a set-up process for calibrating the robot, including a step of aligning the sensors. Initially, a reference wafer is used to establish the nominal positions of the susceptor, the centering station (nominal θ and z positions only), the cool down stations, load lock cassettes and any other position that the system needs. The reference wafer is manually placed 400 at the center of the susceptor (which has already been properly positioned) within the process chamber. When the reference wafer is picked up by the robot, it is properly centered upon the end effector, such that the positions to which it is moved are nominal positions. The wafer is then moved 410 by the robot to each of the cool down or staging stations, the centering station and each of the load lock cassettes. The positions are recorded as nominal positions within the chosen coordinate system. Using the reference wafer, the sensor alignment process 420 is then conducted. This alignment process 420 is shown in more detail in FIG. 8 for one of the sensors.

Figure 8:
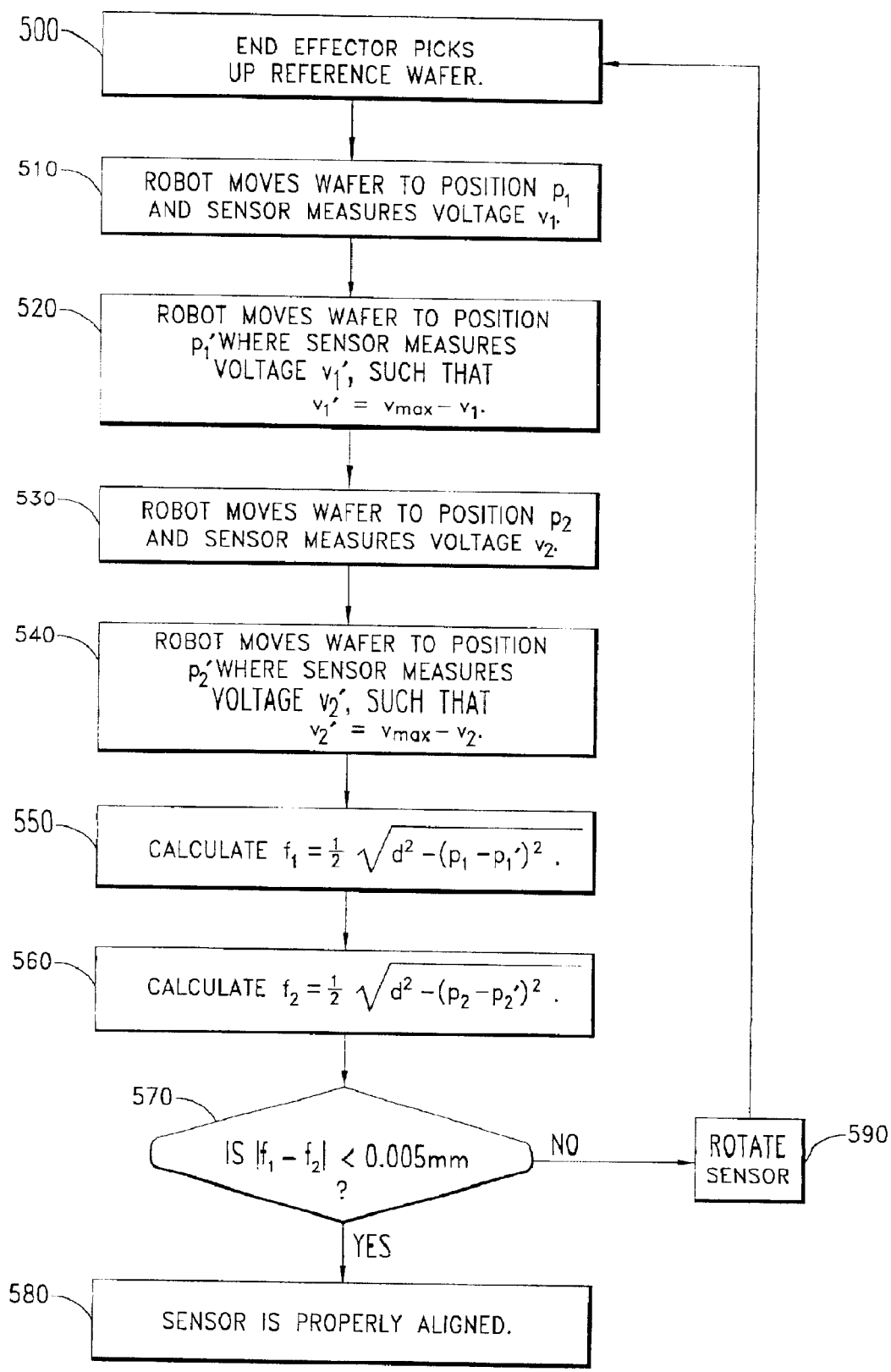
FIG. 8 is a flow chart illustrating a method of aligning the proportionate sensors of FIG. 6, according to a preferred embodiment of the present invention.

FIG. 8 is a flow chart that describes a preferred alignment method for aligning a proportionate sensor so that its longitudinal axis is parallel to the direction of robot translation. In FIG. 8, each sensor 19 is referred to as a laser through beam sensor (LTBS) system. The general translation direction of the robot is determined. As part of the initial setup, the sensor system is installed so that the longitudinal direction of the ribbon-like beam is roughly parallel to the translation direction, by an eyeball approximation. The end effector of the robot picks up 500 a reference wafer, which is also used in determining the nominal positions for the larger process of FIG. 7. In the next step 510, the robot moves the wafer to a first position, $p_1$, where the leading edge of the wafer intercepts a rear portion of the laser beam, and the receiver sensor measures a voltage $v_1$. Under computer control, the robot moves 520 the wafer until the trailing edge of the wafer intercepts the laser beam so that the trailing edge of the wafer is at the same position as the front edge of the wafer was in the first position $p_1$. Accordingly, the front portion of the beam is blocked. The front portion eclipsed should be the difference between the total beam area and the eclipsed by the wafer at the first position $p_1$. The computer knows this position has been reached by monitoring the voltage output and stopping the robot when the receiver sensor reads a second voltage $v_1'$, such that $v_1' = v_{max} - v_1$. The distance (change in R) that the robot has moved to reach this second position, $p_1'$, is recorded. In the present description, the distance traveled in this iteration is referred to as $(p_1 - p_1')$.

Figure 10:
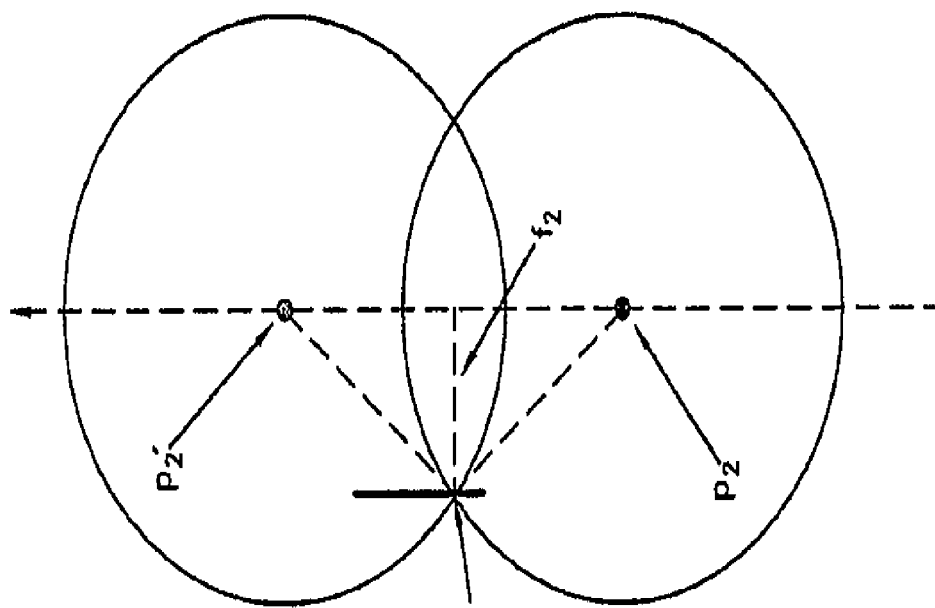
FIGS. 9 and 10 are schematic drawings showing two positions of the wafer in two different iterations during the alignment method.
Figure 9:
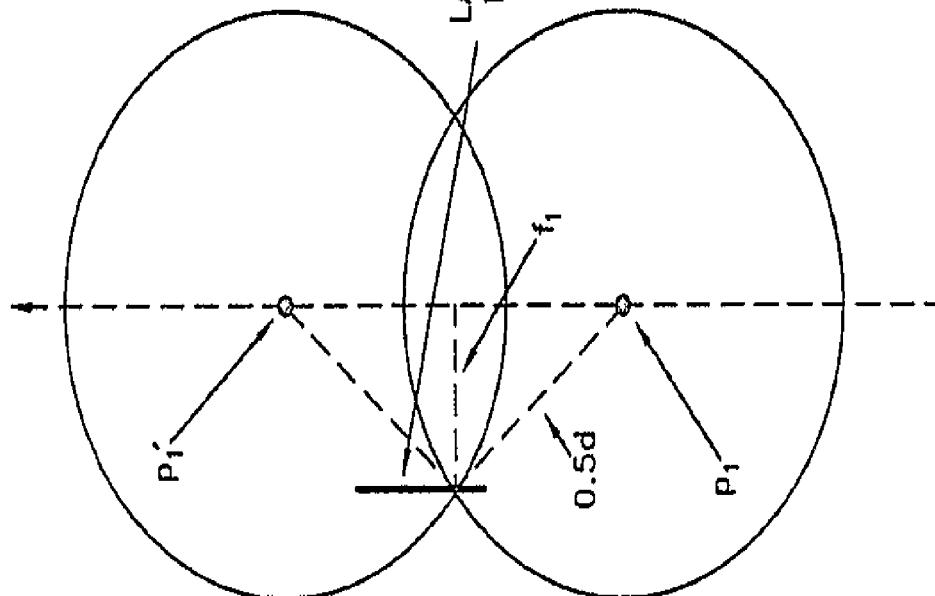
Figure 11:
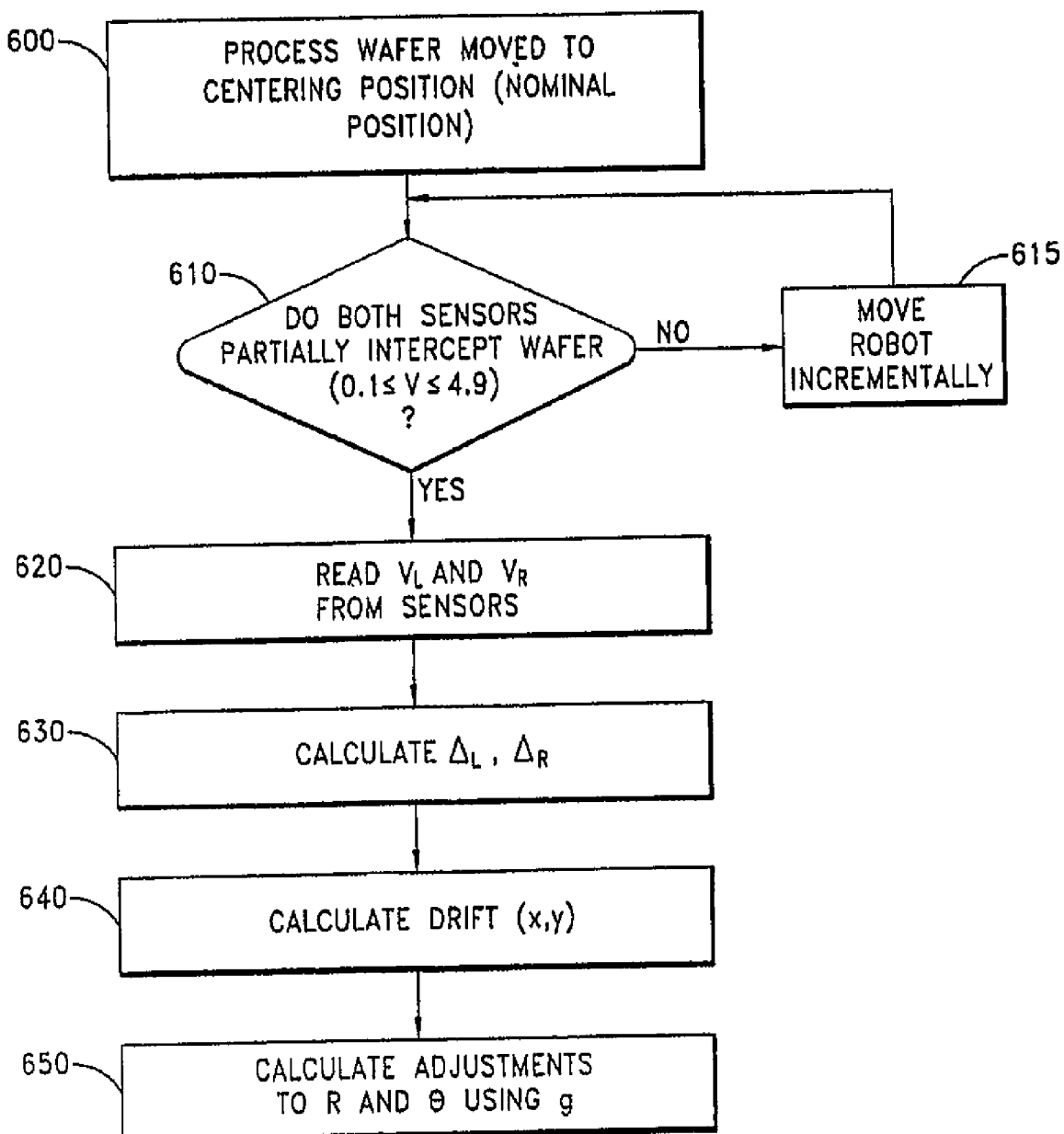
Figure 12:
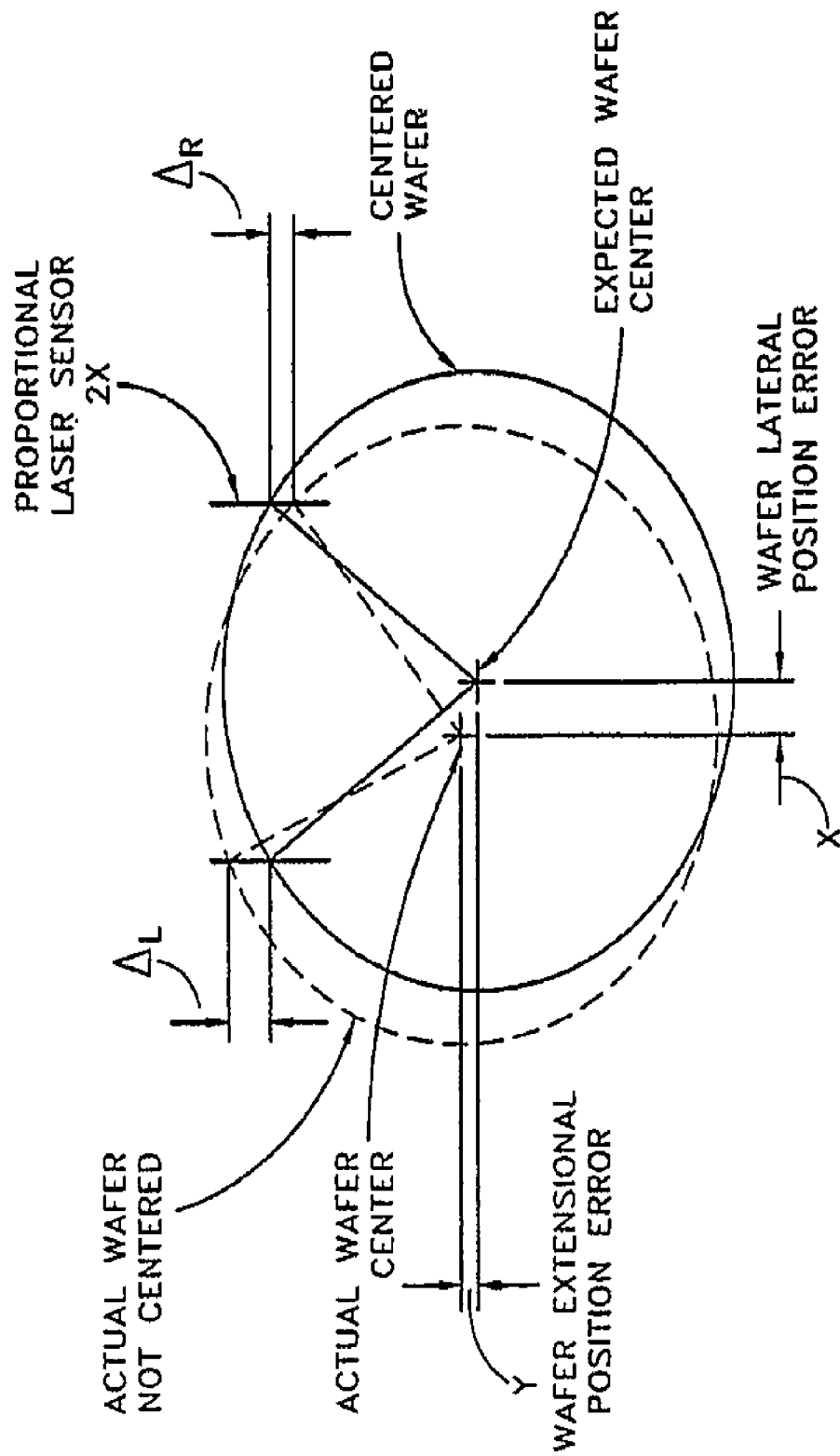
Figure 1:
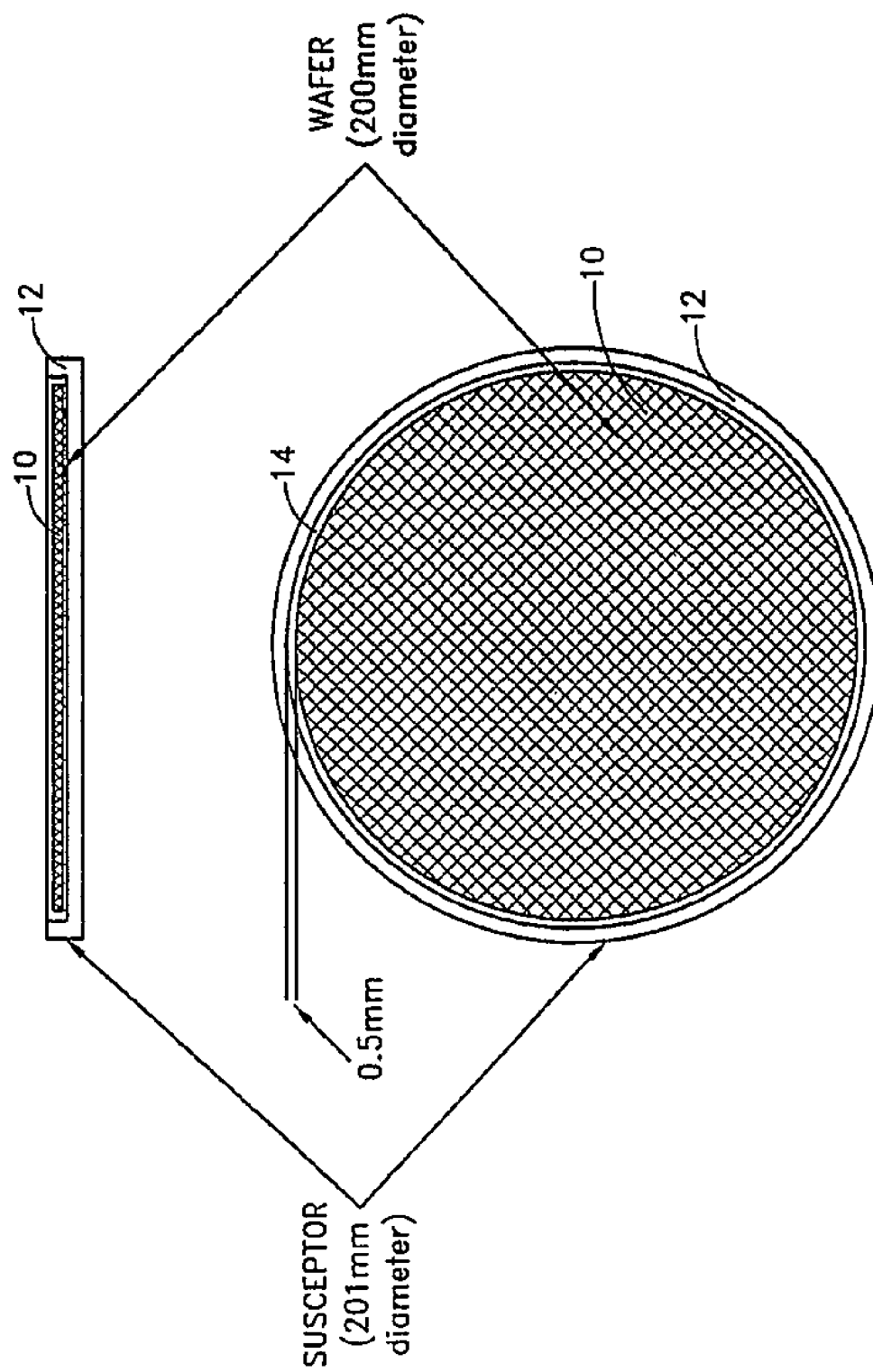
Figure 2A:
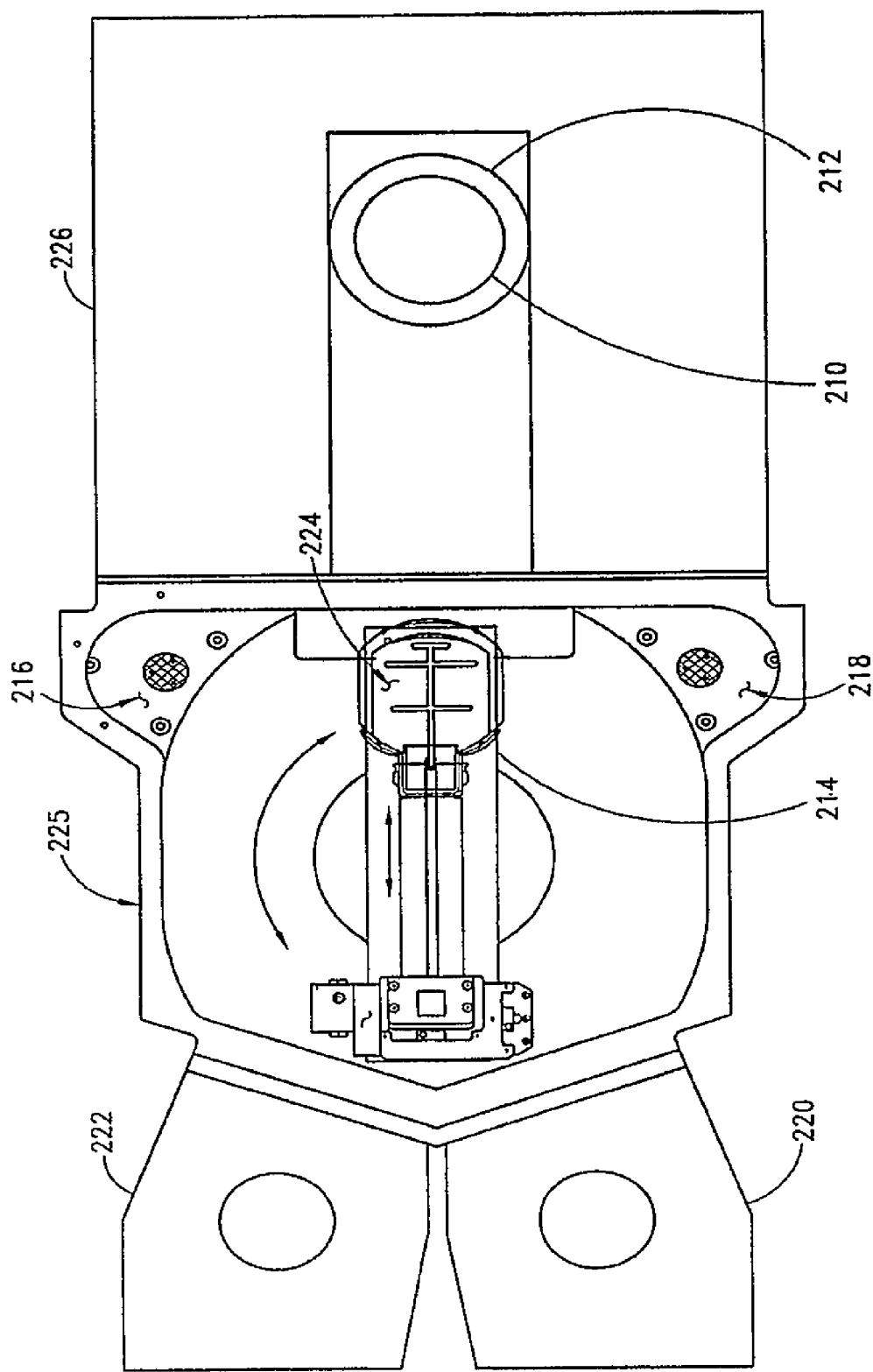
Figure 2B:
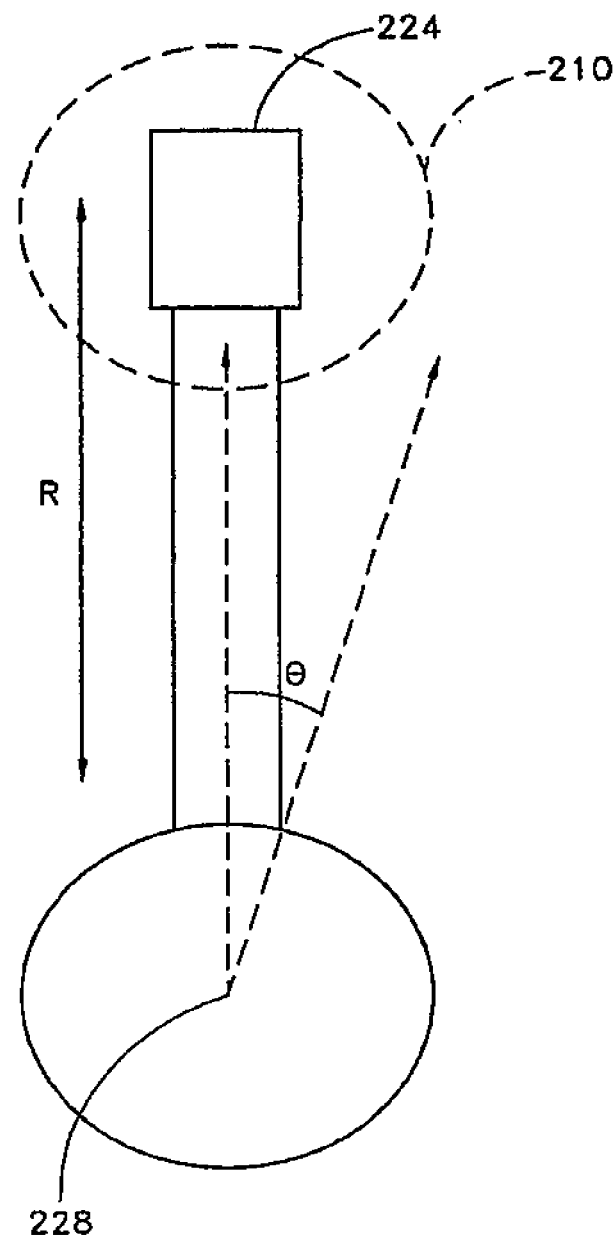
Figure 2C:
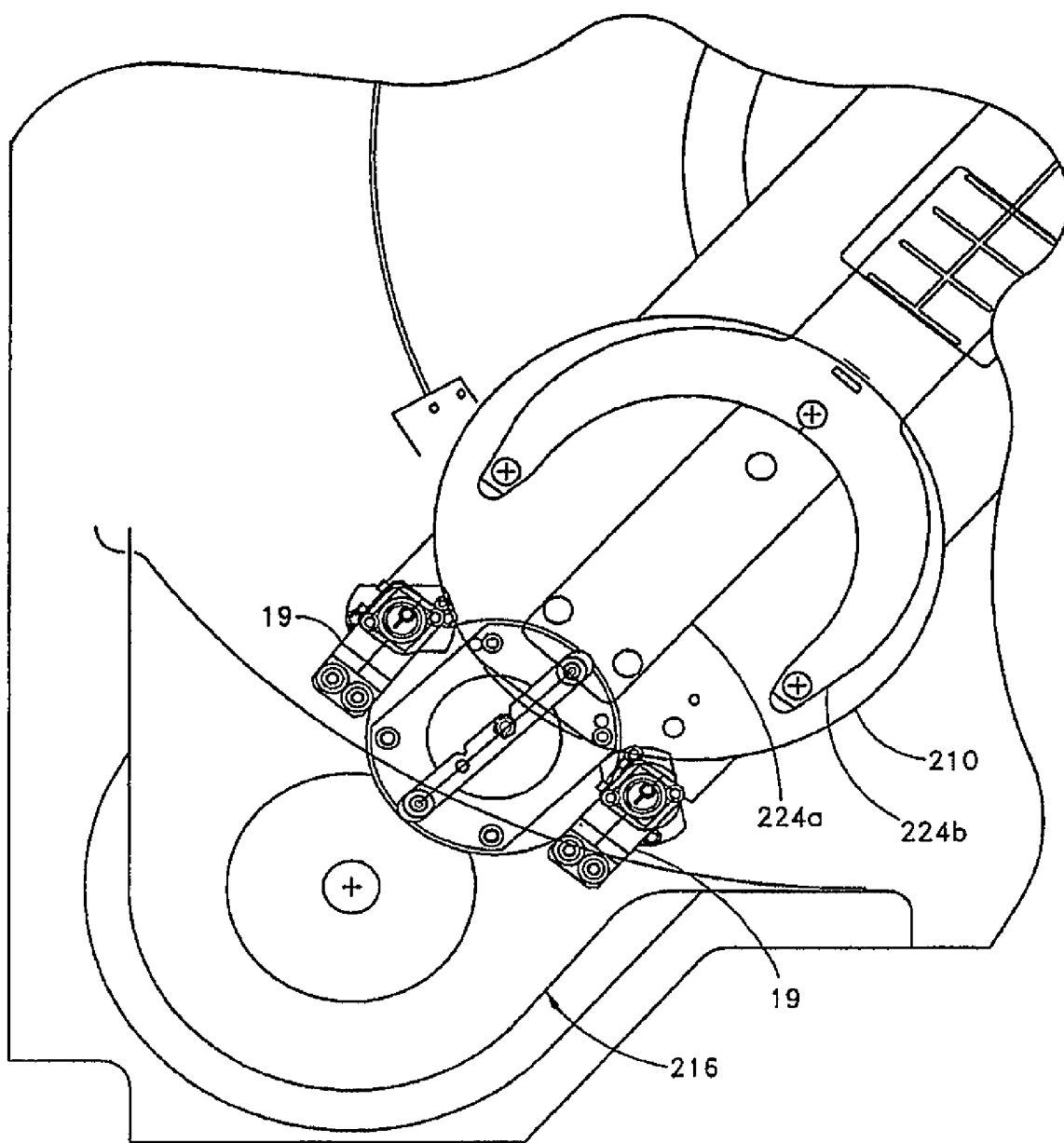
Figure 3:
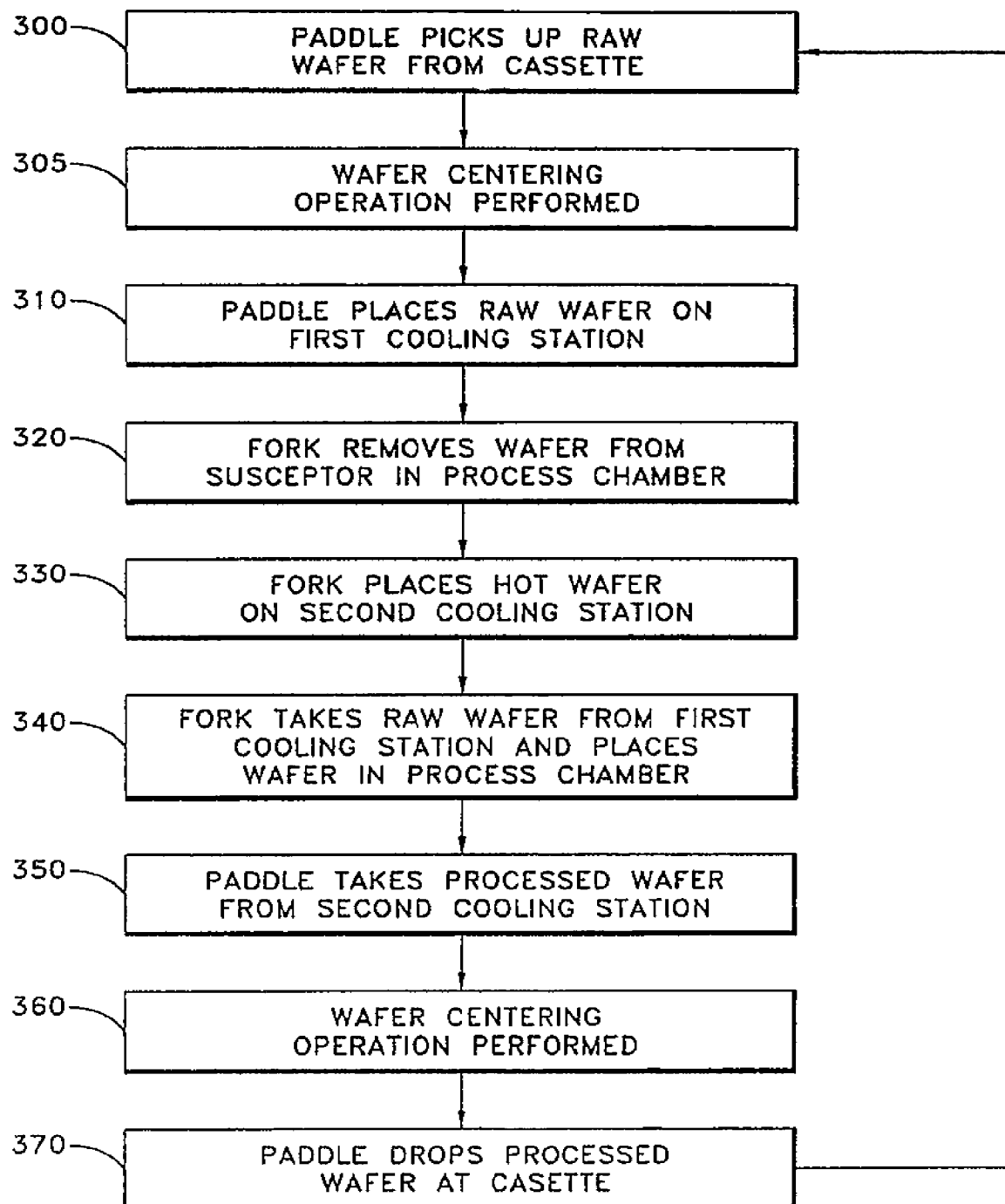
Figure 5:
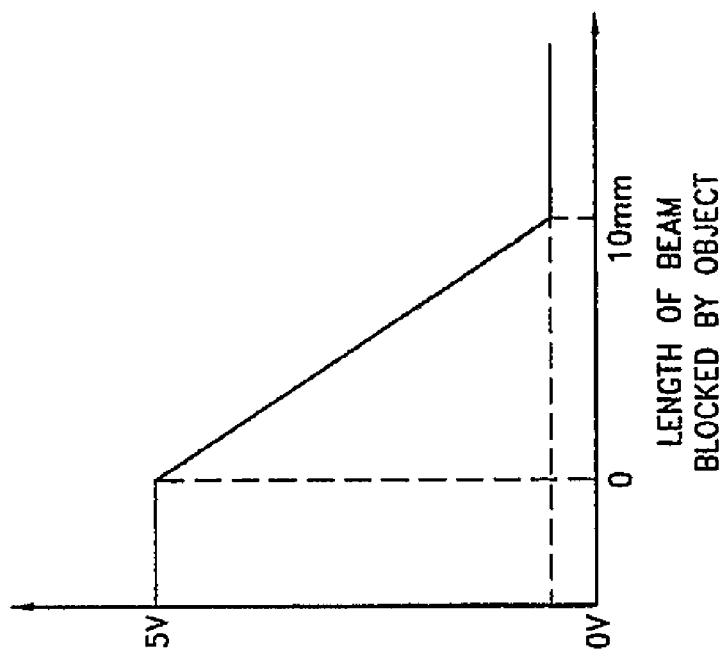
Figure 4:
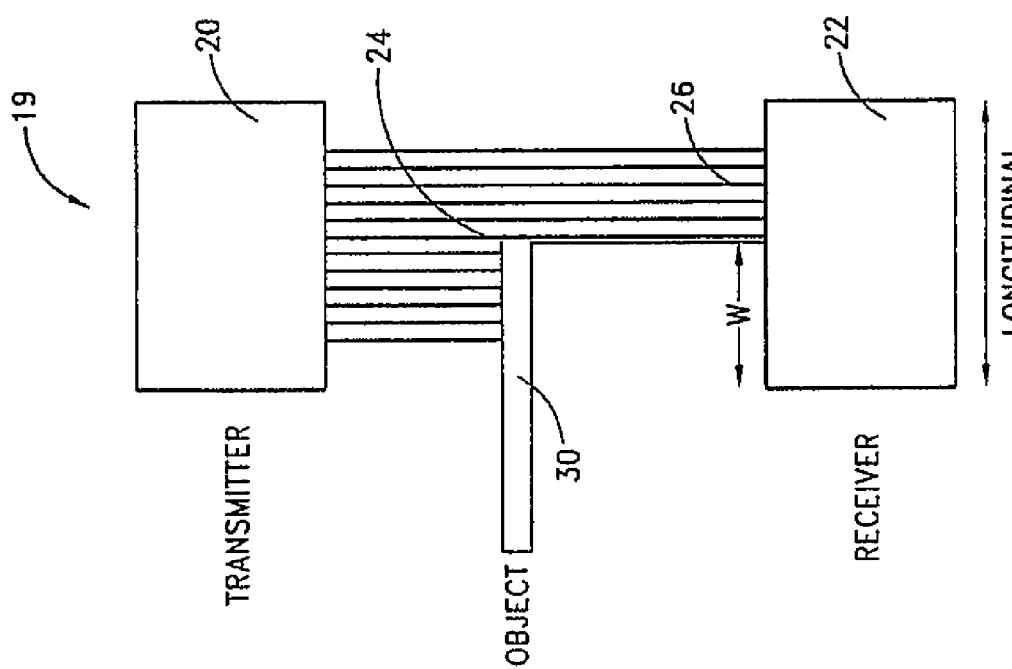
Figure 6:
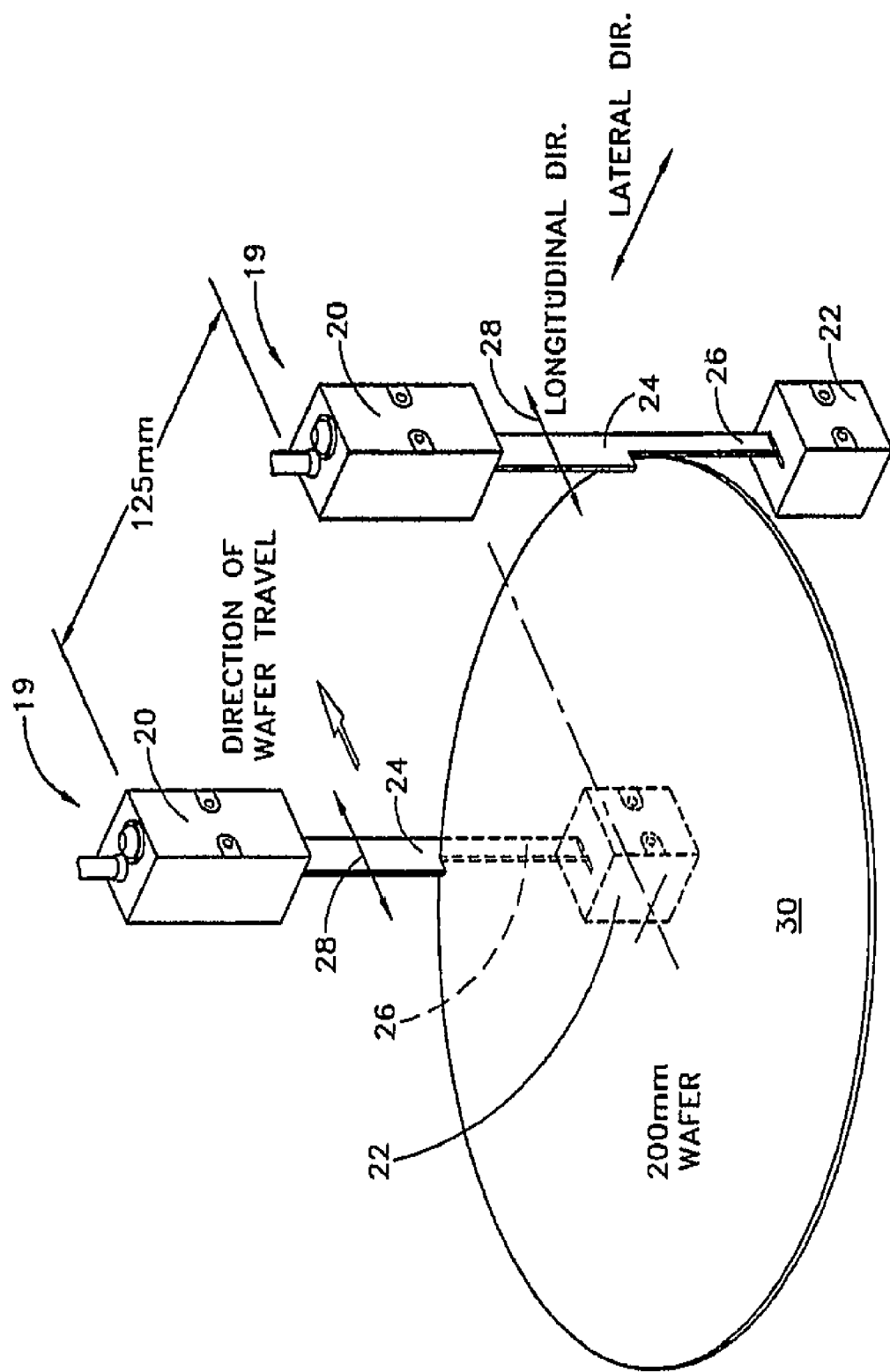
Figure 7:
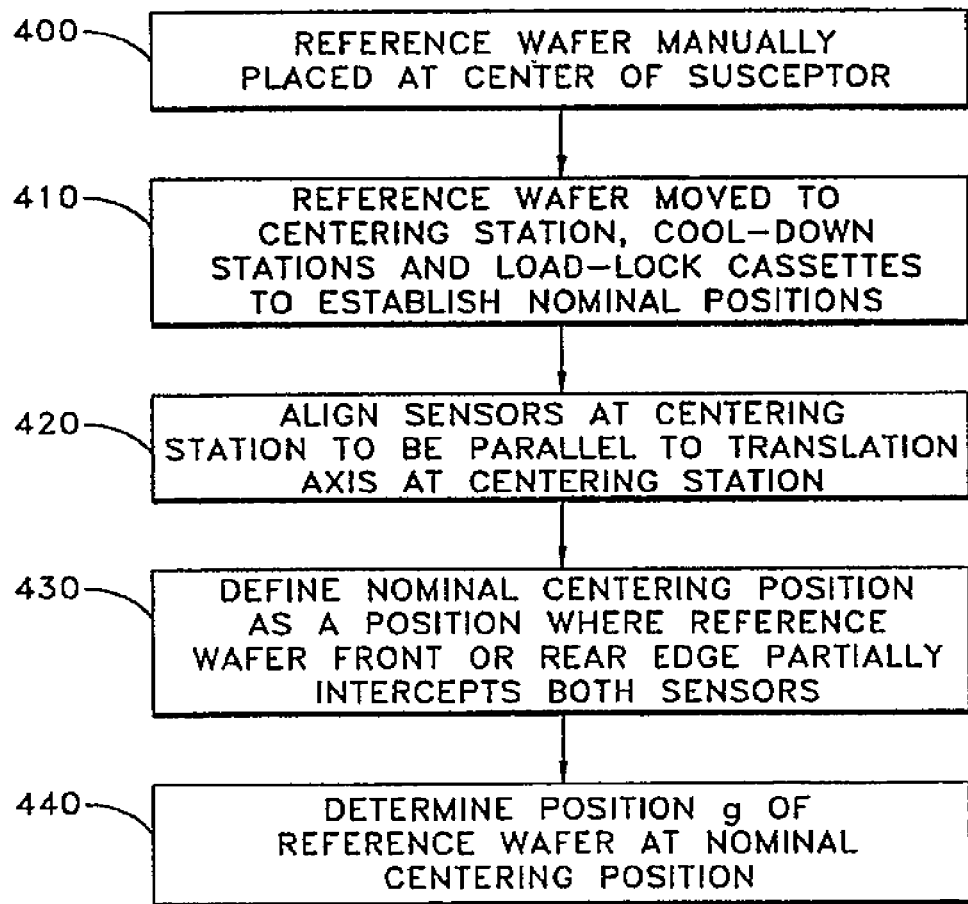
Figure 8:
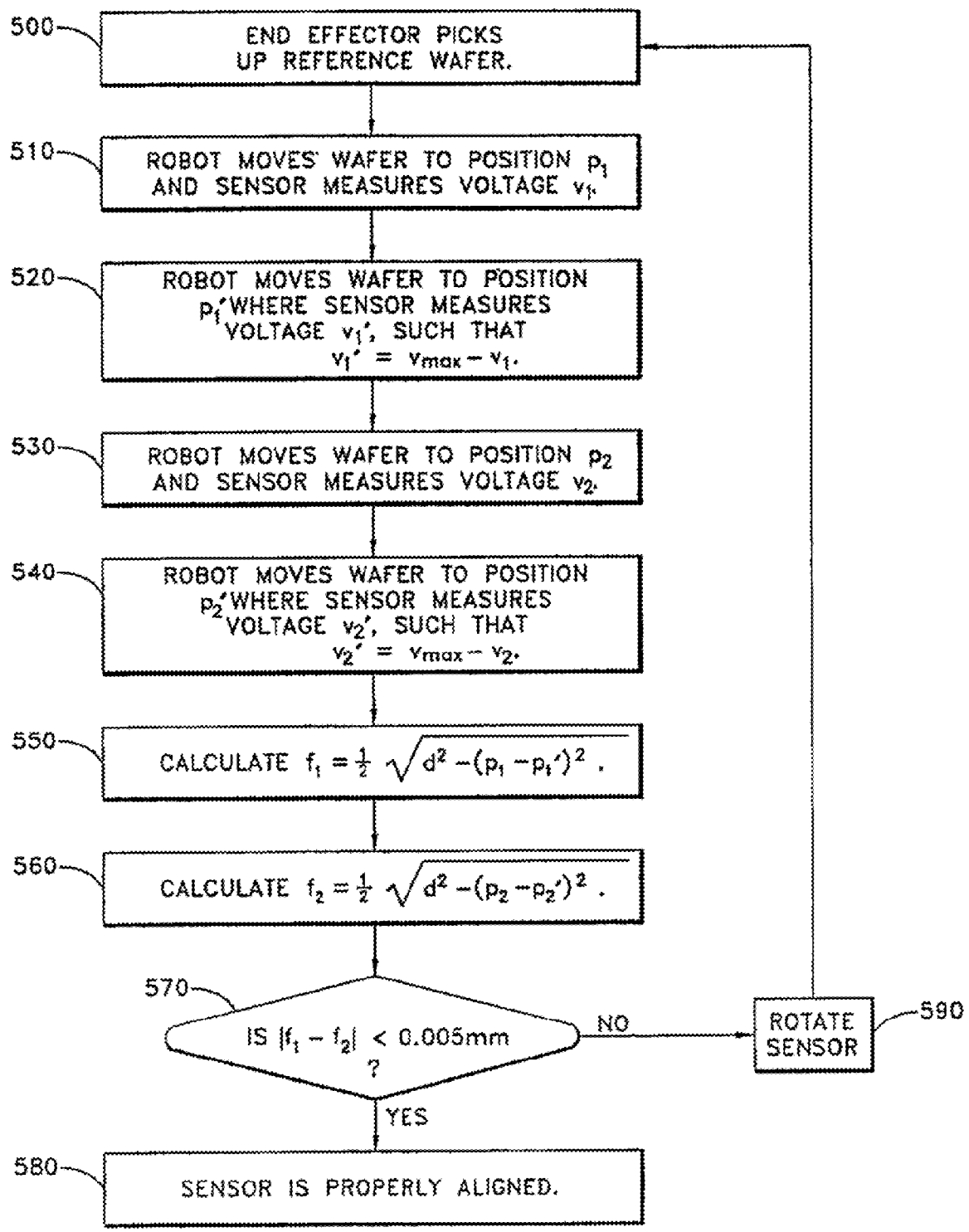
Figure 9:
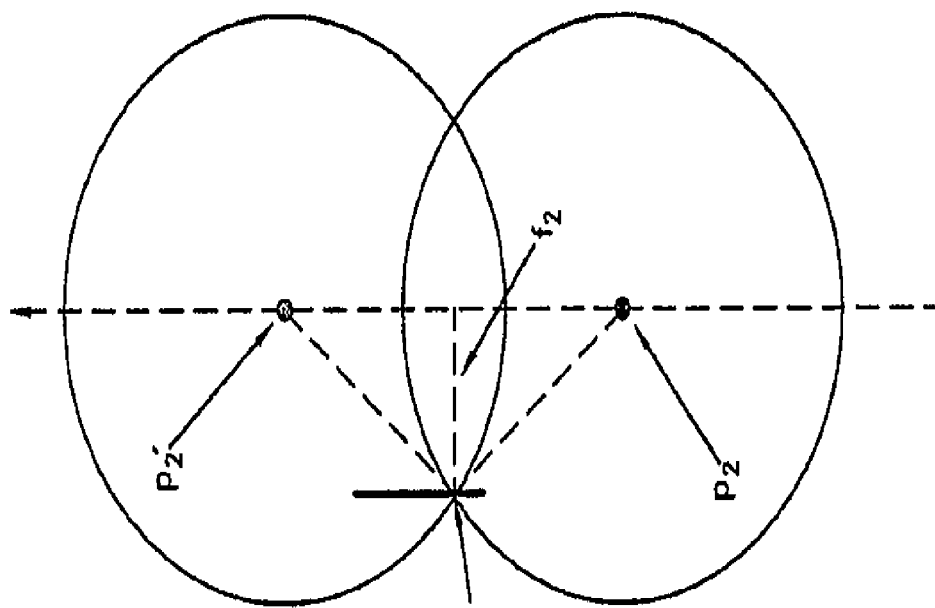
Figure 10:
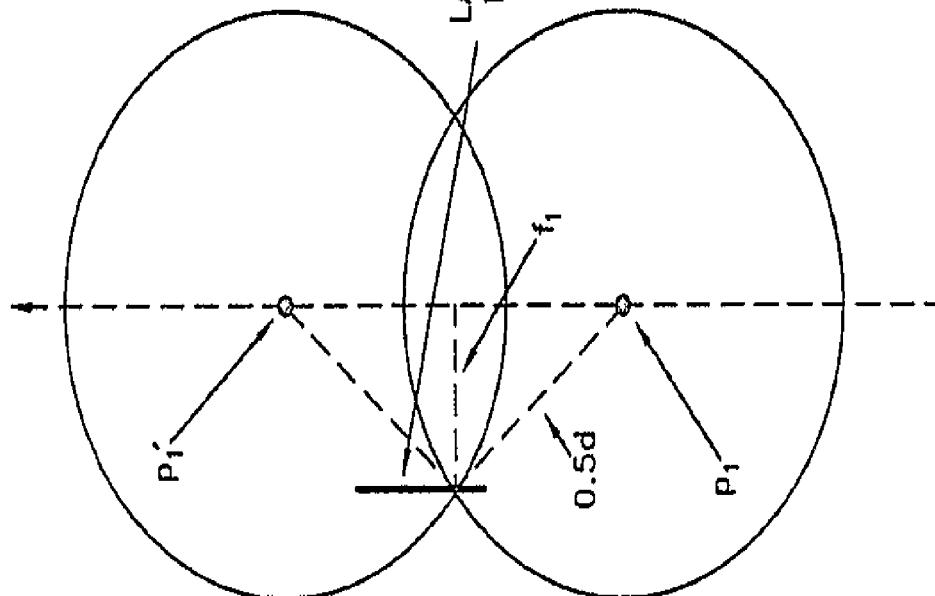
Figure 11:
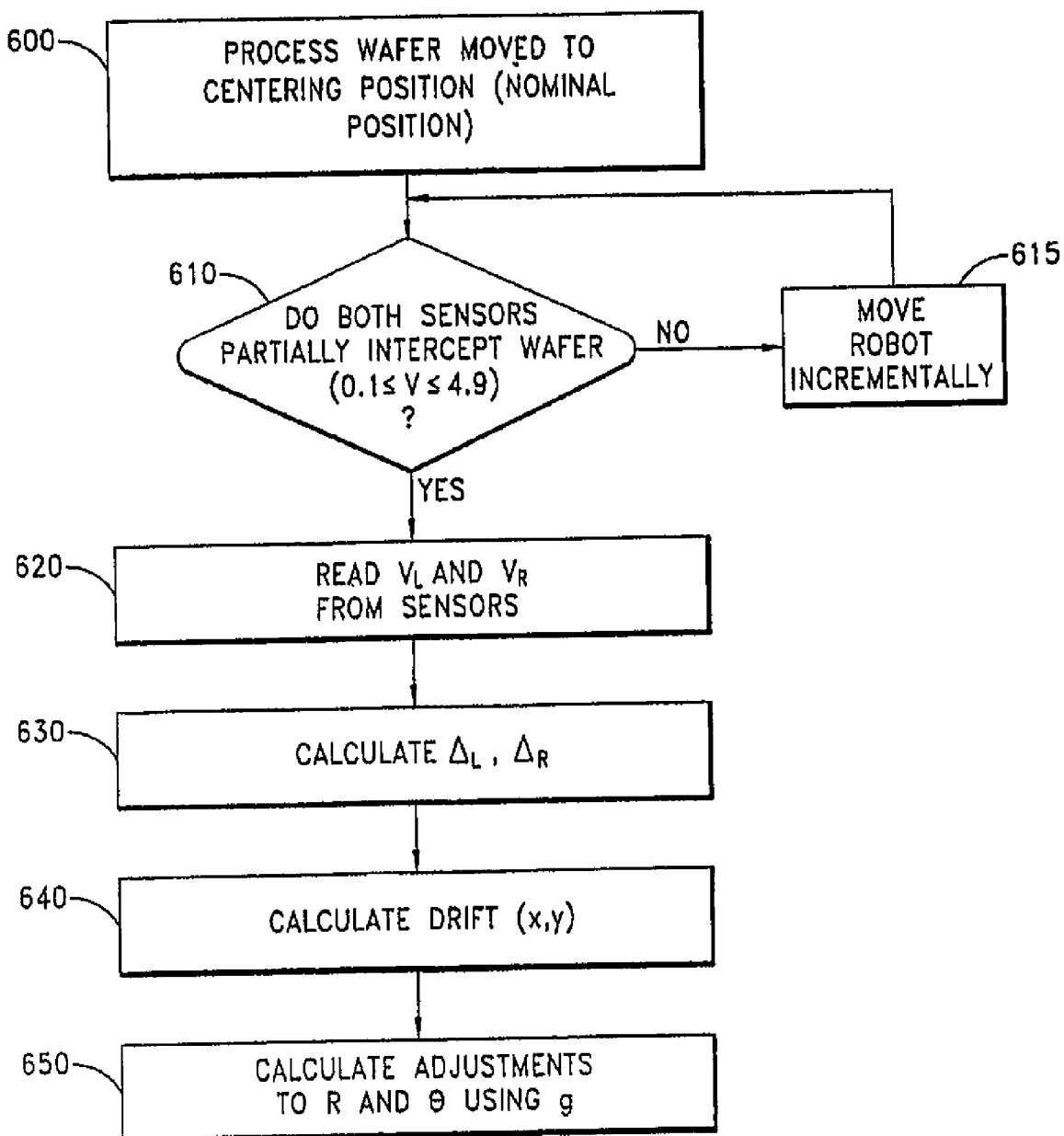
Figure 12:
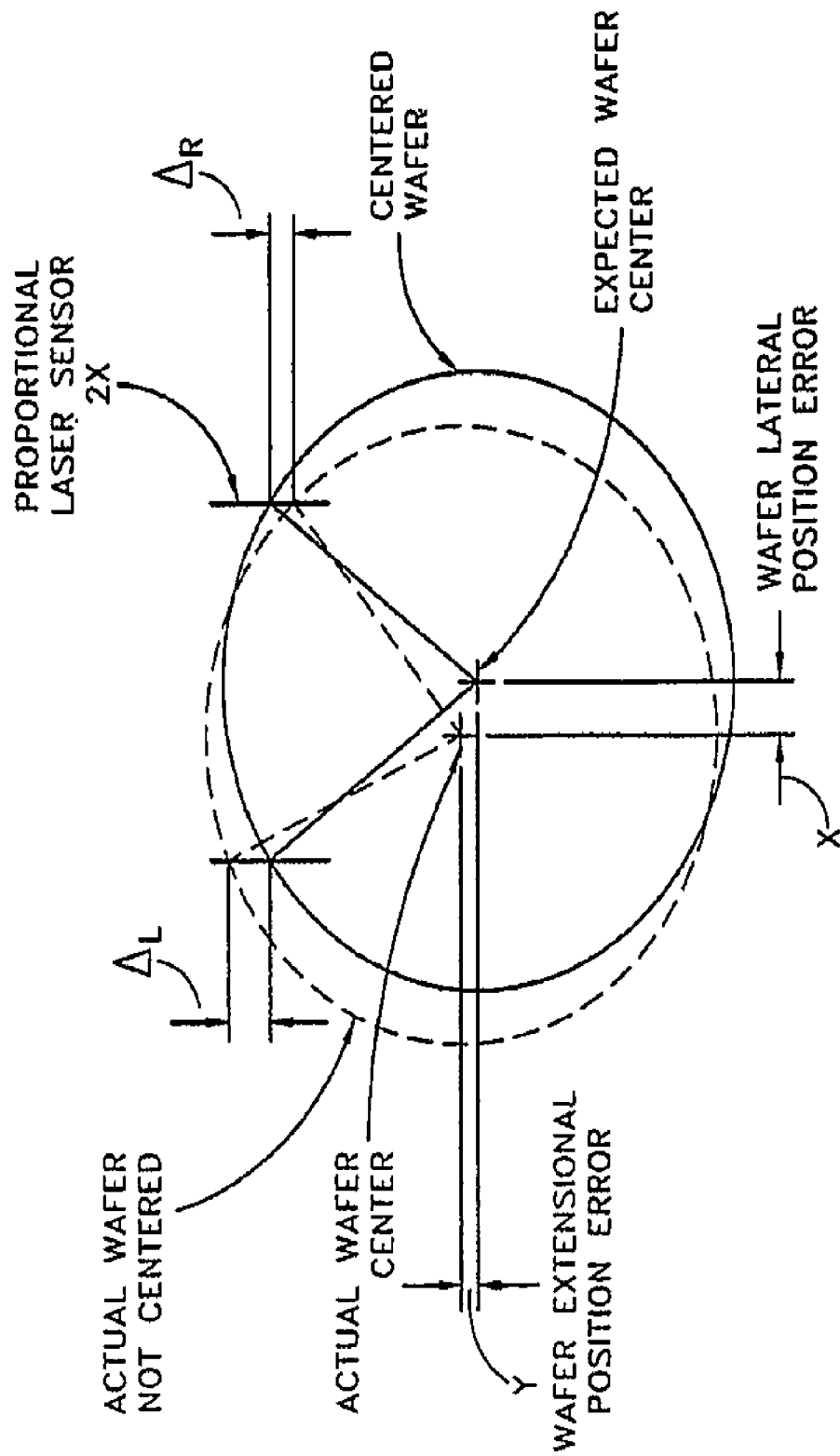

This sequence of movements in steps 510 and 520 is repeated for at least a second iteration, wherein the wafer is moved 530 to a position $p_2$ different from $p_1$, and voltage $v_2$, is determined. The wafer is then moved 540 to a second position $p_2'$ where $v_2' = v_{max} - v_2'$. Two such iterations, showing positions, $p_1$, $p_1'$ and $p_2$, $p_2'$, are shown in the schematic plan views of FIGS. 9 and 10, respectively. At least these two iterations are performed. While only two iterations are shown in FIG. 8, preferably at least three, and more preferably five such iterations are performed before the determination is made that the sensor is parallel to the direction of robot translation.

If the sensor is aligned parallel to the direction of the robot movement, the measured distance $(p_1 - p_1')$ should be the same for each iteration i. As will be appreciated, any function that depends upon this measured distance can be used to determine whether the sensor is parallel to the direction of robot translation. In the illustrated embodiment, the term $f_i$ is calculated and compared for each iteration i because $f$ is a measure of the lateral spacing of the sensors that will be used in the preferred calculations of the wafer position during operation. This can be seen in the FIGS. 9 and 10. If $f_i$ is approximately equal for each iteration i, then the sensor is determined to be parallel to the direction of robot translation.

Using the known wafer diameter, d (in mm.), and the positions, $p_1$, $p_1'$, $p_2$, $p_2'$ (in mm.), as determined in steps 510–540 above, the parameters $f_1, f_2$, are calculated according to the equation:

$$f_i = \frac{1}{2}\sqrt{d^2 - (p_i - p_i')^2}$$

for i={1,2} as represented by steps 550 and 560. The parameters is proportional to the distance between the line indicating the robot translation path and the longitudinal line of the laser beam at the point, $p_1$. When $f_1$ and $f_2$ are equal, the laser beam longitude is parallel to the robot translation direction. At decision box 570 the following question is asked: Is $\Delta f = |f_1 - f_2|$ less than a predetermined tolerance? Preferably, the predetermined tolerance is ±0.05 mm, more preferably ±0.005 mm (shown in FIG. 8). If the answer is yes, the LTBS system is determined to be properly aligned 580. More preferably, five iterations are performed and determined to result in the same value of $f$ for each iterations. If the answer is no, it is necessary to rotate 590 the LTBS system incrementally and repeat the procedure starting at step 510. Furthermore, if $f_1 > f_2$ then the sensor system needs to be rotated clockwise, whereas if $f_1 < f_2$ then the sensor system needs to be rotated counterclockwise, assuming that the second iteration is conducted forward of the positions for the first iteration. It will be understood that a tolerable deviation of other than 0.005 mm can be set, depending upon the system's tolerance for deviation from parallel.

The process of FIG. 8 is separately conducted for each of the two sensors. In this fashion, the sensors are each aligned with the direction of robot translation (and therefore aligned parallel to one another) and the values of $f$ for each sensor ($f_L$ and $f_R$) are recorded. These terms are proportional to and preferably equal to the distance between the sensors and the robot axis of translation (which preferably extends through the reference wafer center).

The example outlined in the foregoing discussion and in FIG. 8 is given as an illustration of the current invention and is not meant to limit it in any way. Although the example is given for a silicon wafer, this method can be adapted for other substrates of other type and shape. Additional iterations of the alignment steps can be performed to increase the number of sampled points along the laser beam, and, therefore, further increase the accuracy of the alignment. Furthermore, the method can be used in systems with multiple sensors.

Referring back to FIG. 7, after both of the sensors are aligned using the process of FIG. 8, a nominal centering position is next defined 430 where the centering operation will be initiated during operation. In this step 430, the reference wafer is used to define a position of the robot at the centering station where the reference wafer partially intercepts both of the sensors. The wafer is advanced along the appropriate robot translation axis so that the leading edge portion of the reference wafer partially eclipses or intercepts both of the sensors simultaneously at a selected wafer position (hereinbelow the "nominal centering" or "nominal robot" position). In operation, the nominal centering position is the position to which the robot is initially advanced during a drift determination operation.

The nominal centering position, at which both sensors are only partially blocked by the reference wafer, may be obtained via an iterative process. For example, the robot may be used to move the reference wafer to a predetermined position at the centering station. If both sensors are unblocked at the predetermined point, the robot may be incrementally advanced (R increased) in the translation direction. If both sensors are completely blocked, the robot may be withdrawn along the line of translation. These steps may be repeated until both sensors are simultaneously partially blocked by the wafer.

It is not necessary that the two sensors be blocked to the same degree. For example, in the present embodiment, in which the sensors output an analog voltage within a range of 0 V to 5.0 V, the left sensor may output 2.0 V, while the right sensor outputs 3.0 V, due to imperfect installation of the sensor systems.

The voltages obtained at this nominal centering position are used as reference voltages $V_{ref}$ for each sensor, which will later be employed in the calculation of wafer drift, while the position of the robot is used as the nominal centering position in the later assessment of wafer drift during operation. The nominal centering position is preferably selected such that 0.5 V<$V_{ref}$<4.5 V. More preferably, the nominal centering position is such that 2.0 V<$V_{ref}$<3.0 V for each sensor. Most preferably, the reference wafer edge intercepts each sensor near the center of the sensor length, such that $V_{ref}$ is close to 2.5 V, because such a nominal centering position results in a greater likelihood that slightly decentered wafers will partially eclipse both sensors during operation. At this point, $V_{ref}$ is close to 2.5 V. These preferred voltage levels can be prorated, as a percentage of maximum voltage, for different proportionate sensors. The reference voltages represent the location that the wafer edge is expected to intercept the sensor when the wafer is in the "nominal wafer position" at which the wafer is properly centered upon the end effector.

If linear translation does not find a position at which both sensors are partially blocked with 0.5 V<$V_{ref}$<4.5 V, then the sensors are parallel but longitudinally offset by too great an amount. Preferably, the sensors are reset and the process of FIG. 8 repeated to align the sensors parallel to the direction of translation. Note that similar a positioning process conducted before the alignment process of FIG. 11 can incrementally change the θ position of the robot in order to locate the roughly installed sensors relative to the robot coordinate system.

Furthermore, the wafer may optionally then be advanced to a second nominal centering position at which the two sensors are simultaneously and partially blocked by the trailing edge portion of the reference wafer. An iterative process similar to that described above may be employed to obtain the second nominal wafer position. This position and the reference voltages obtained from the sensors may also be used in the later assessment of wafer drift during operation. It will be understood that, in operation, either the front edge of the wafer or the trailing edge or both can be used to determine wafer drift.

Referring again to FIG. 7, initial setup also includes determining where the reference wafer is located when positioned at the nominal centering position. This can be done by calculating or determining 440 a parameter g, which represents the value of R for the center of the reference wafer at the nominal centering position. Because the selected manner of calculating g employs a calculation of intentionally induced wafer drift, the description of g calculation is deferred to follow description of drift calculation as used in operation.

Calculation of Wafer Drift Using Leading Edge Sensor Data

The device has been fully calibrated once the steps of assessing sensor alignment and obtaining nominal centering position and reference voltages described above have been completed. The device may now be used to assess the drift of objects from the nominal position during operation, such as wafers removed from the load lock cassettes to be processed in the reactor.

Figure 11:
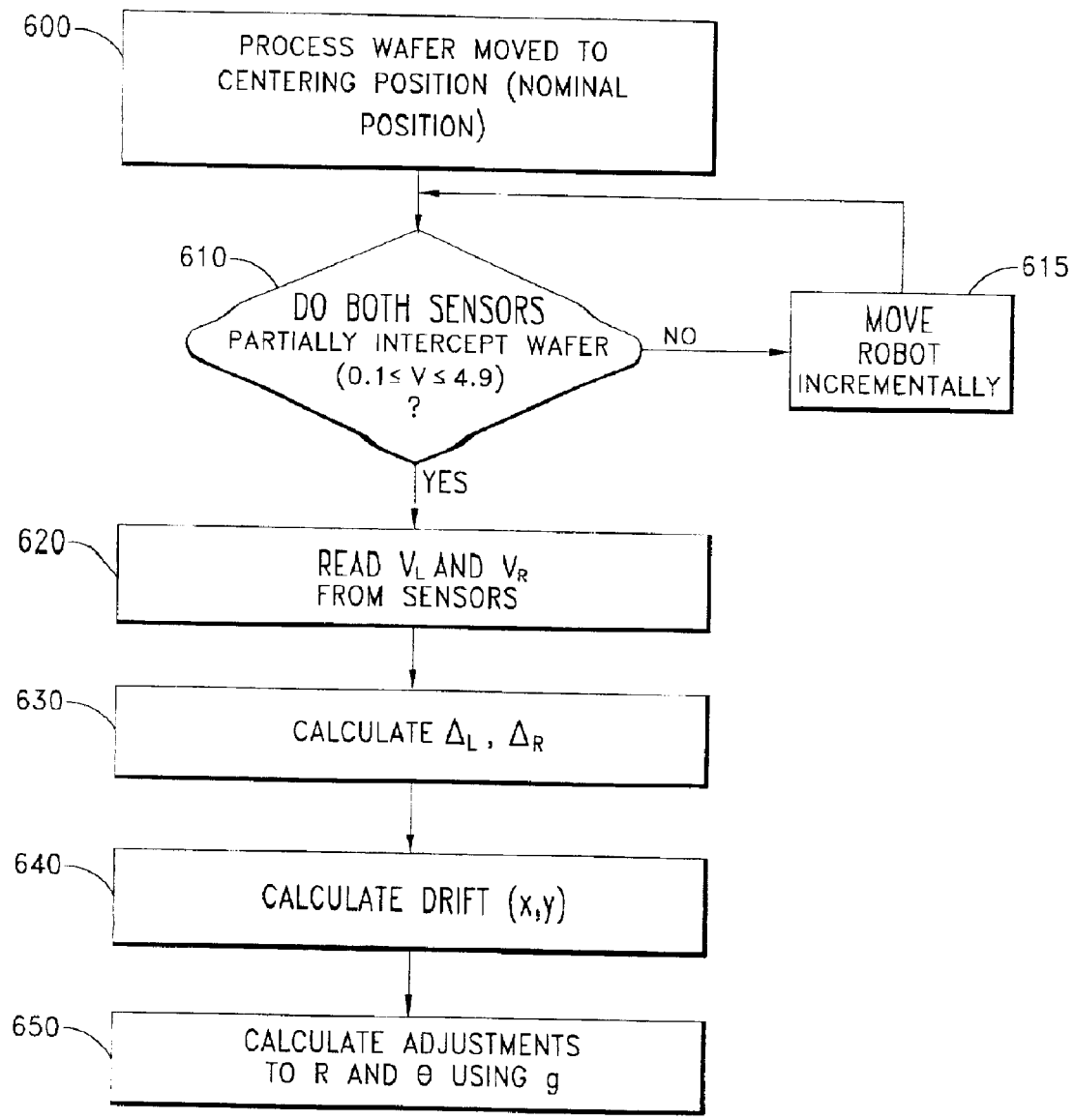
FIG. 11 is a flow chart illustrating a process of calculating wafer drift and the adjustment for wafer drift.

Referring to FIG. 11, the robot transfers a wafer to be processed from one load lock cassette to the centering station. The robot is moved 600 to the nominal centering position. At this point, the leading edge of the wafer should partially block or intercept both of the sensors. If, at decision box 610, one or both of the sensors are determined to be either completely unblocked or completely blocked, the robot can be iteratively moved 615, until both sensors are partially eclipsed by the wafer. These iterative movements 615, performed to ensure that the drifted wafer intercepts both sensors, are referred to herein as a "dance." Note that the iterative movements can include advancement, retraction or rotation. During operation, it is no longer important that wafer be moved parallel to the sensors. For a margin of safety, "completely unblocked" is arbitrarily defined as a position at which V>4.9 V while "completely blocked" is defined as a position at which V<0.1 V for either sensor. The skilled artisan will appreciate that different threshold voltages can be set for this purpose. If iterative movements are required to have the wafer edge partially intercept both of the sensors, the computer merely records the change in robot position $R_d$ and $θ_d$ caused by the "dance," and these changes are reversed during the later adjustment process.

If both sensors are partially blocked at the nominal centering position (return a value between 0.1 V and 4.9 V) then it is possible to assess the drift of the wafer from the nominal position. The voltage output $V_L$ and $V_R$ are read 620. If the wafer has drifted from the expected or nominal wafer position upon the robot end effector, the sensors indicated a deviation from the $V_{ref}$ recorded for each sensor. Since the wafer geometry is known to be the same as that of the reference wafer, this deviation can be used to calculate the linear distance that the wafer has drifted from the nominal wafer position, and this drift can be compensated by moving the robot such that the wafer is placed in a manner to compensate for the drift. The skilled artisan will appreciate a number of ways in which this drift and compensating movements can be calculated. The formulas given below are merely exemplary.

The deviation in voltage readings are used to calculate 630 offsets $α_L$ and $α_R$. $Δ_L$ and $Δ_R$ represent the linear deviations from the nominal wafer position, as measured longitudinally along the sensors (see FIG. 12). $Δ_L$ and $Δ_R$ maybe obtained from the following equation:

$$Δ = \frac{l_{max} - l_{min}}{V_{max} - V_{min}}(V_{ref} - V)$$

Here, $l_{max}$ and $l_{min}$ represent maximum and minimum sensor laser beam lengths left unblocked by the wafer, $V_{max}$ and $V_{min}$ represent the output value of the sensors when $l_{max}$ and $l_{min}$ are left unblocked, $V_{ref}$ indicates the sensor output value when the reference wafer is at the nominal wafer position while the robot is at its nominal centering position, and V indicates the sensor output value when the process wafer is at the nominal wafer position and the sensor is thus partially blocked. For the illustrated embodiment, $l_{max}$=10 mm, $l_{min}$=0 mm, $V_{max}$=5 V, and $V_{min}$=0, so that $$Δ=2(V_{ref}-V)$$

This linear deviation of the wafer edge intercepts with the sensors is then used to calculate 640 the positional drift of the wafer. The drift is represented by parameters $(x_1, y_1)$. The values of $x_1$ and $y_1$ may be calculated from the following equations:

$$x_1 = \frac{1}{2}\left[f_L - f_R + \sqrt{\left(\frac{d}{s}\right)^2 - 1}\left(\Delta_L - \Delta_R + \sqrt{\left(\frac{d}{2}\right)^2 - f_L^2} - \sqrt{\left(\frac{d}{2}\right)^2 - f_R^2}\right)\right]$$

$$y_1 = \frac{1}{2}\left[-\sqrt{\left(\frac{d}{s}\right)^2 - 1}(f_L + f_R) + \right.$$

$$\left.\left(\Delta_L + \Delta_R + \sqrt{\left(\frac{d}{2}\right)^2 - f_L^2} + \sqrt{\left(\frac{d}{2}\right)^2 - f_R^2}\right)\right]$$

$$s^2 = (f_L + f_R)^2 + \left(\Delta_L - \Delta_R + \sqrt{\left(\frac{d}{2}\right)^2 - f_L^2} - \sqrt{\left(\frac{d}{2}\right)^2 - f_R^2}\right)^2$$

Here, $f_L$ and $f_R$ are obtained during the calibration, d represents the wafer diameter, and $\Delta_L$ and $\Delta_R$ are the linear deviation at the sensors, as derived from the measured voltage deviations. The calculated x value represents wafer drift, relative to the nominal wafer position (reference wafer), in the lateral direction, perpendicular to the direction of robot translation. The calculated y value represents wafer drift, relative to the nominal wafer position (reference wafer), in the longitudinal direction, along the direction of robot translation.

Figure 12:
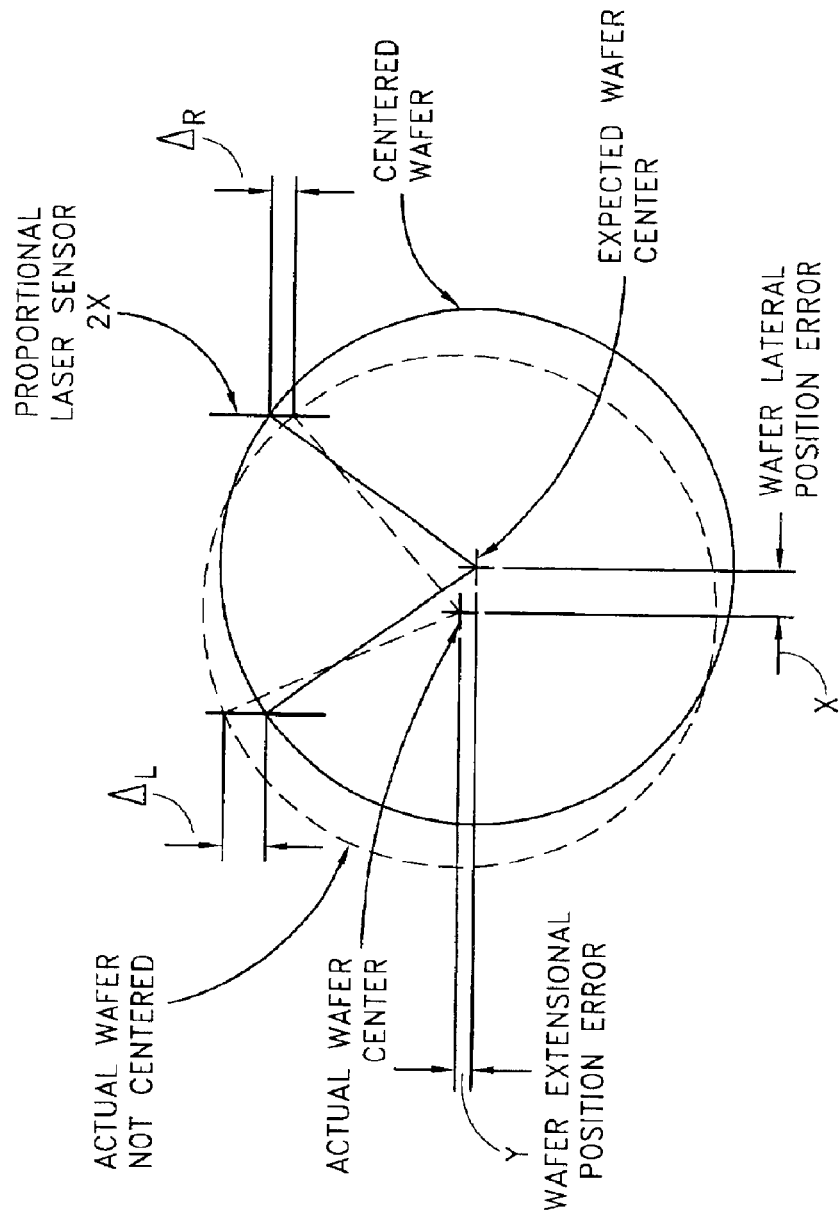
FIG. 12 is a schematic drawing showing expected or nominal wafer positions at the centering station and the actual location of a drifted wafer.
Figure 1:
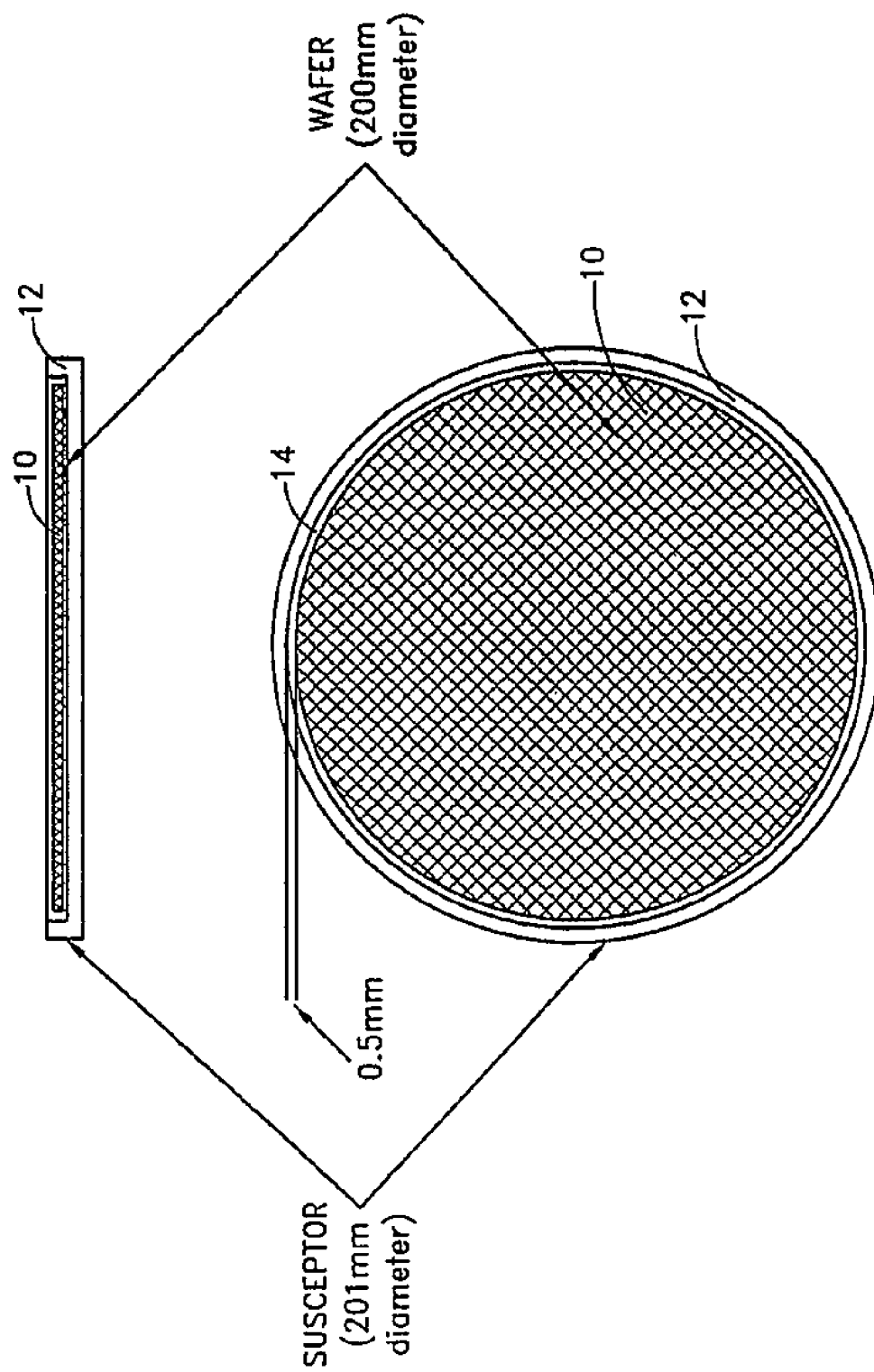
Figure 2A:
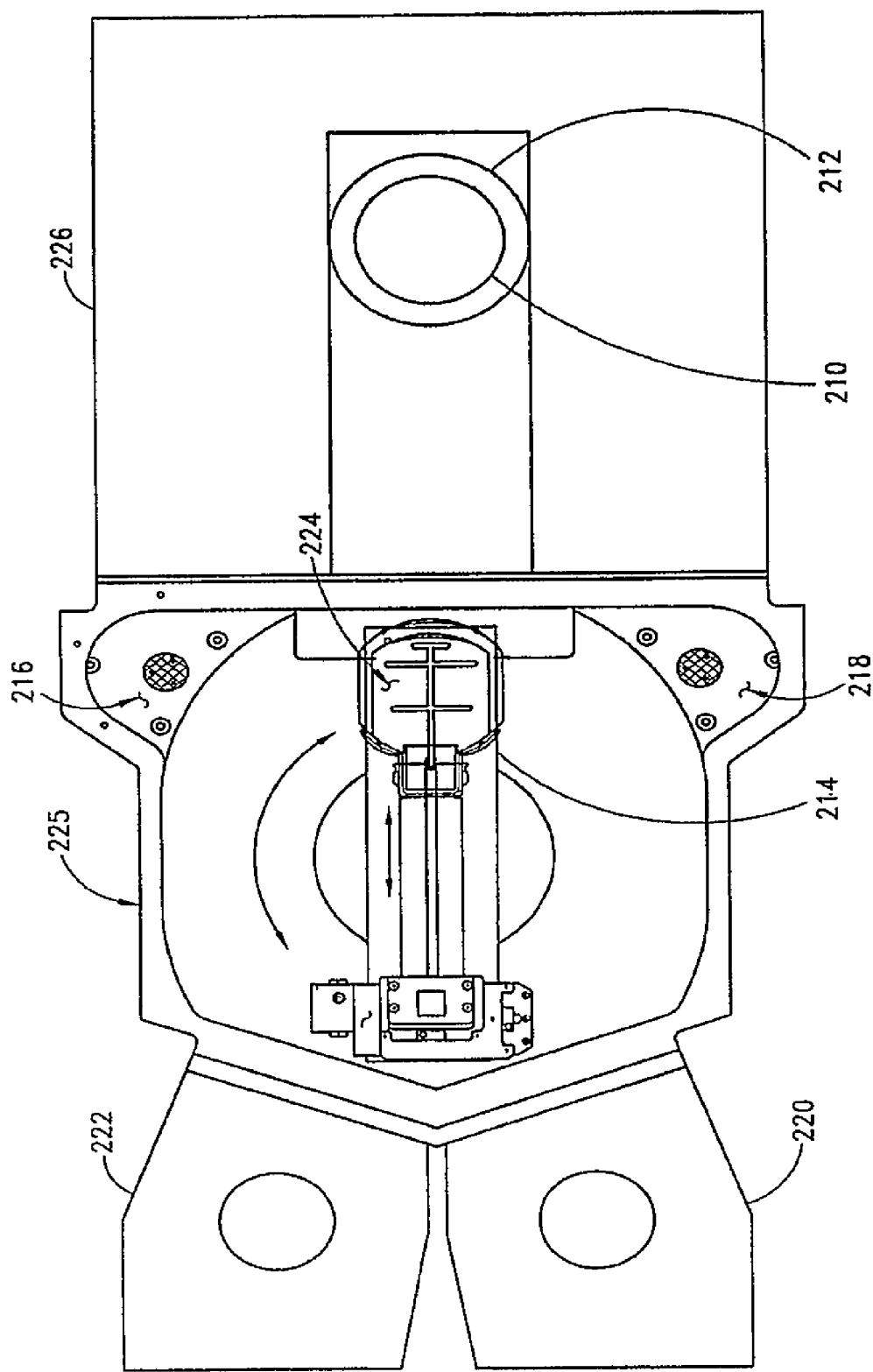
Figure 2B:
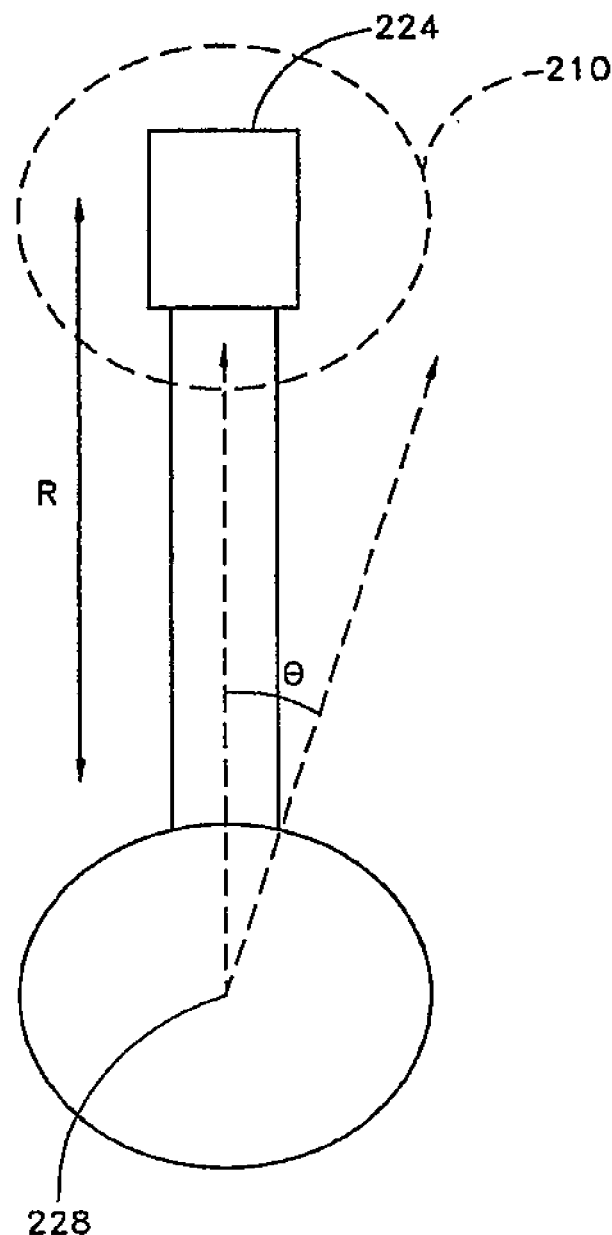
Figure 2C:
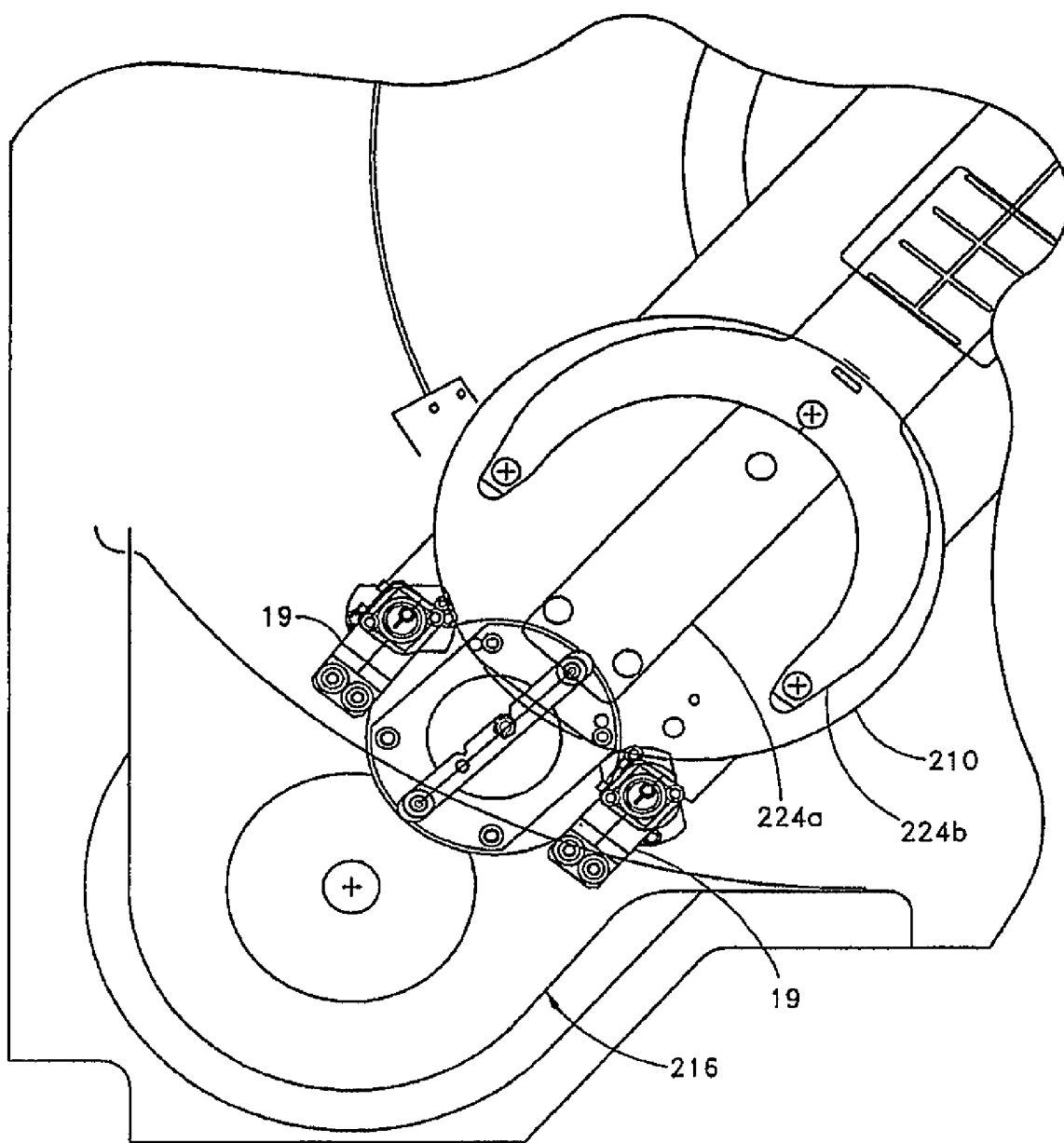
Figure 3:
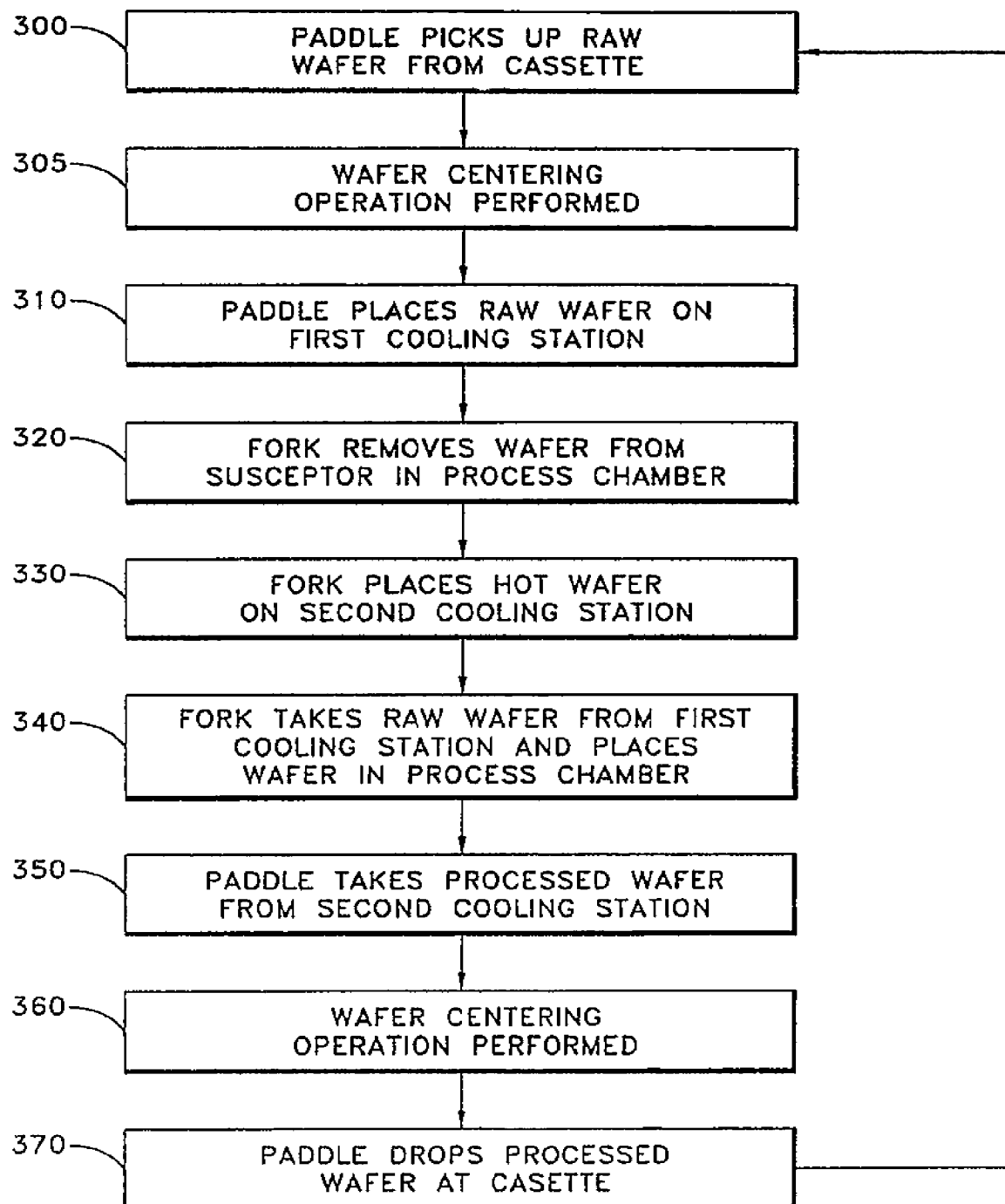
Figure 5:
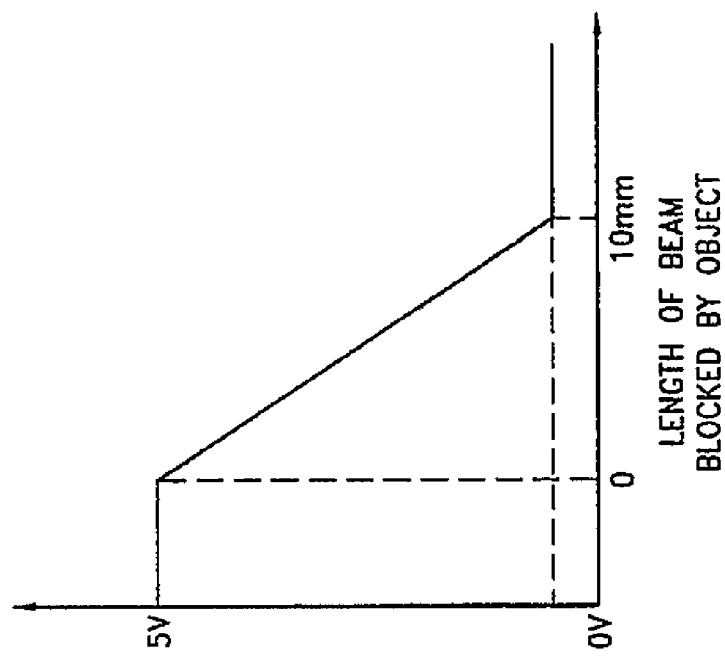
Figure 4:
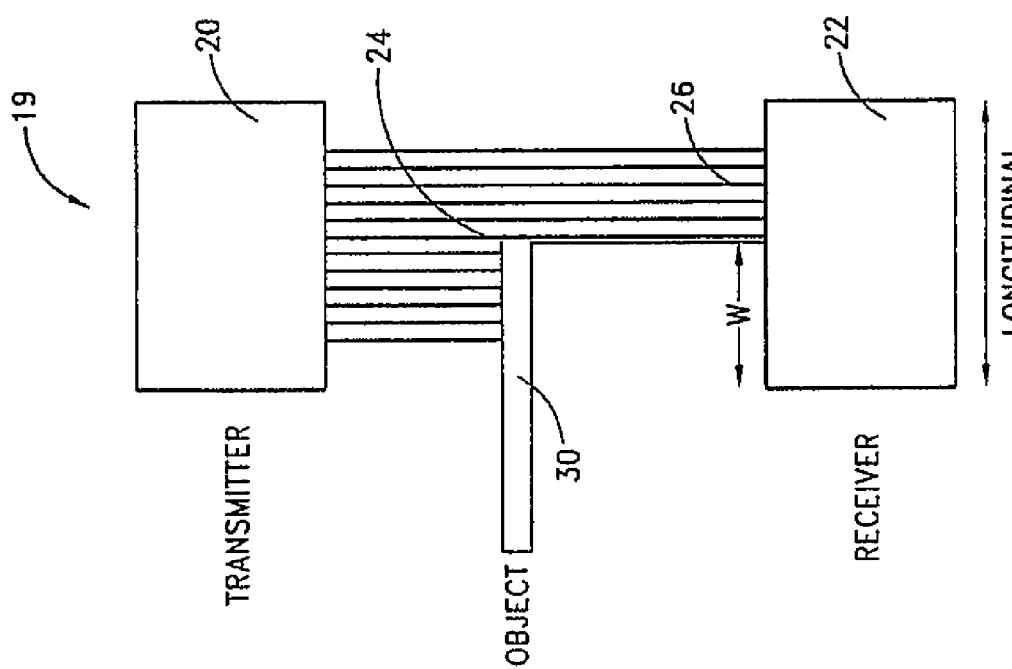
Figure 6:
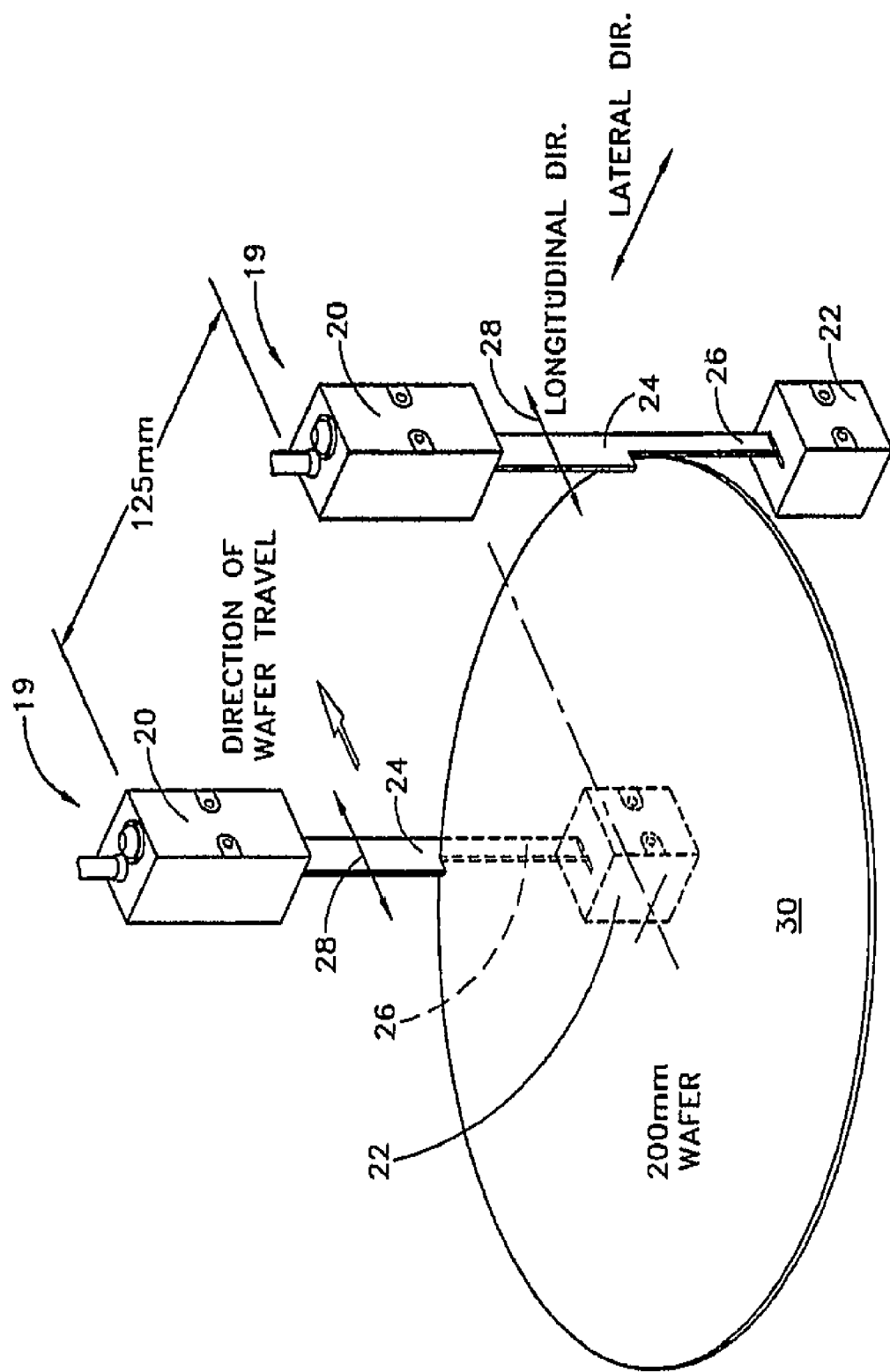
Figure 7:
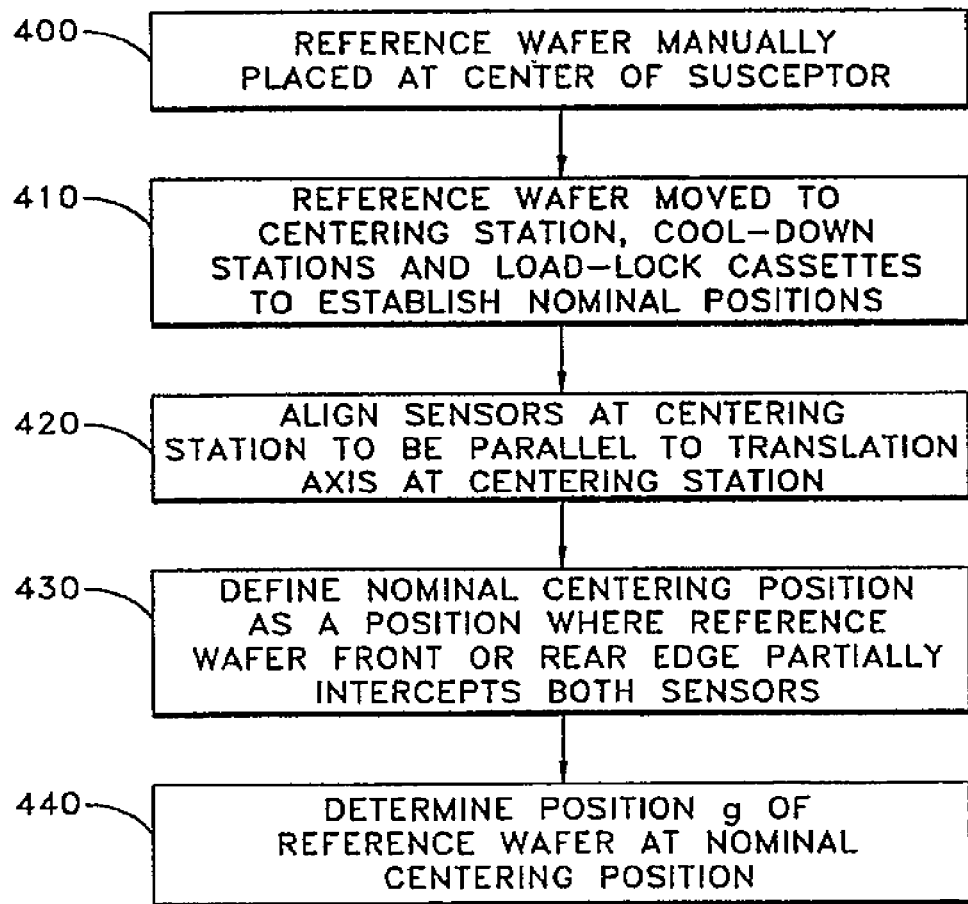
Figure 8:
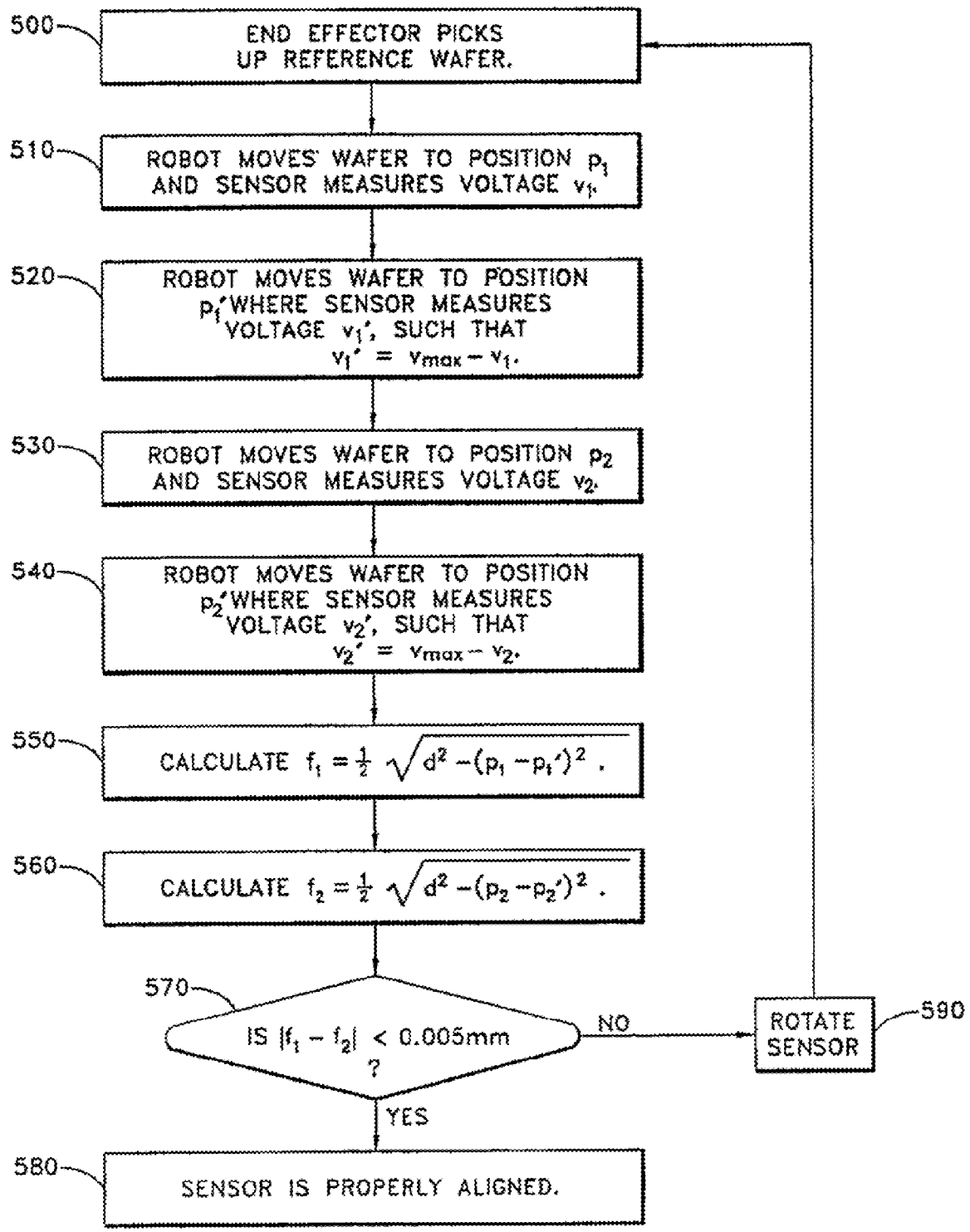

FIG. 12 illustrates a decentered wafer in a dotted line, and the nominal (expected) wafer position in a solid line. In the drawing, x represents the indicated wafer lateral position error, while y represents the indicated wafer extensional position error.

Wafer Position Determination

Referring again to FIG. 7, as noted above, part of the initial setup process is determining 440 where the wafer is actually, relative to the coordinate system of choice, at the centering station. This need only be done once, using the reference wafer, during setup, and is thus not part of the drift calculation process of FIG. 11. Having described the drift calculation, the determination 440 of g can be better understood.

The parameter g represents the distance between the reference wafer in the nominal centering position and the coordinate system origin (pivot of rotation of the robot). This is measured/calculated because the robot parameter R, which is presumed known at all times, is measured relative to the tip of the end effector and not to a centered wafer position. In the preferred embodiment, the parameter g is preferably obtained in the following manner. The reference wafer is placed at the centering station and is rotated through a small angle $\theta$ with respect to the position of the robot. This small rotation creates an artificial drift that can be calculated as described above for the calculation of wafer drift during operation. The value of lateral induced drift $x_g$ is then obtained using the equations for s and x above. The value of g can then be determined by substituting the value of $x_g$ obtained into the following formula:

$$g = \frac{x_g}{\sin\theta}$$

Note that this value of g may be obtained either at the first or second nominal wafer position, and this difference may be represented by $g_1$ and $g_2$; in correcting the drift, the g value employed should match position at which the data relating to the process wafer were obtained. For better accuracy and precision, this procedure can be repeated for different values of $\theta$.

Calculation of Wafer Drift Using Trailing Edge Sensor Data

If reference values were obtained at the trailing edge portion of the reference wafer during the calibration process, the wafer to be processed may instead or additionally be advanced to the second nominal centering position, at which the sensor voltages are recorded.

The device determines the values $x_2$ and $y_2$ using the sensor voltages obtained at the trailing edge of the wafer in the manner described above, except that, in the equations employed, $f_L$ and $f_R$ need to be exchanged, $\Delta_L$ and $\Delta_R$ need to be exchanged, and the sign of $\Delta_L$, $\Delta_R$, and y needs to be changed, because of the geometry of the round wafer.

The drift of the wafer calculated using the trailing-edge values is represented by $(x_2, Y_2)$. If both leading edge and trailing edge data are collected, the measured drifts at both edges can be compared. The calculated drift should at least approximately coincide. If this is the case, $(x_1, y_1)$ and $(x_2, y_2)$ may be optionally averaged, and the resulting $(x_{avg}, y_{avg})$ may be used as the measure of wafer drift. If only the trailing edge data is employed, the wafer drift is taken as $(x_2, Y_2)$.

Adjustment for Wafer Drift

Referring again to FIG. 11, once the drift has been obtained, the robot may be adjusted so as to compensate for the drift and accurately position the wafer for later processing. Thus, adjustments to the robot path are calculated 650. In the illustrated embodiment, these adjustments take the form of adjustments to the robot position parmeters R and $\theta$, as indicated by the formulae below. The formulae below assume the adjustment is performed at the centering station using the g parameter that indicates position of the wafer, as discussed above. When $(x_1, y_1)$ is employed as the wafer drift parameters, the g parameter used is that calculated using data obtained at the first nominal centering position (using the wafer front edge), while when $(x_2, y_2)$ is employed as the wafer drift parameters, the g parameter used is that calculated using data obtained at the second nominal centering position (using the wafer trailing edge). When $(x_{avg}, y_{avg})$ is used, the g parameter is also averaged. $\Delta R$ indicates the compensating change along the translation axis, while $\Delta\theta$ indicates the compensating change in angular position. Furthermore, x may represent either $x_1$ or $x_2$, and y may represent either $y_1$ or $y_2$, or these may be averaged values. Similarly, g may represent $g_1$, $g_2$, or an averaged g value $g_{avg}$.

$$\Delta R = g - \sqrt{x^2 + (g+y)^2} - R_d$$

$$\Delta\theta = \sin^{-1}\left(\frac{-x}{\sqrt{x^2 + (g+y)^2}}\right) - \theta_d$$

$R_d$ and $\theta_d$ represent changes to the robot position incurred during a "dance" to ensure interception of a drifted wafer's edge with both sensors.

Correction of drift may alternatively be performed at the centering station or at any other location. An example thereof is adjustment at to staging or cool down station just before wafer drop-off. For drift compensation at a location other than the centering station, it is determined how far the robot has extended or retracted (change in R) from position g. This extension or retraction is represented by the value $\delta$. The compensation parameters $\Delta R$ and $\Delta\theta$ at this extended/retracted position are calculated by substituting $(g+\delta)$ for g in the above equations.

It is preferable that all measurements, both during calibration and during the determination of wafer drift, be taken a number of times and the results averaged, in view of the nature of analog sensors and the high sensitivity of laser sensors. The number of measurements which should be taken for any value depends on the field conditions and the analog input boards used, as well as the averaging method adopted for the application. Furthermore, all quantities employed in the equations above are based on the SI unit system.

One advantage of the method of wafer sensor alignment is that the approach has been derived and proven rigorously in mathematics and is not empirical. The calculation requires only a minimum number of independent variables that are easy to measure accurately, ensuring that the result is accurate. The method is reliable. It does not require complicated software or complicated mechanical adjustments. The hardware is all commercially available, inexpensive, compact and easy to install. The method is flexible because drift is detected and corrected by comparison to a designated reference wafer, rather than absolute wafer position measurements which are heavily reliant upon the robot, its position and its spatial relation to fixtures in the tool. The method does not require any particular transport robot; nor any real-time signal acquisition. Existing wafer processing equipment can be easily retrofitted with the system. The system can be scaled to different wafer sizes and can be used in applications requiring the sorting of wafers or aligning of wafers according to flat or notch orientation. The system could also be used to detect the roundness of a wafer or the dimensions of a wafer, such as its diameter.

Notch/Flat Detection

Today's SEMI standard calls for wafers with one notch or flat. If desired, the system described herein can be arranged to accommodate wafers with notches or flats at the front edge or trailing edge of the wafer. If a notch or flat is at the front edge, the trailing edge of the wafer can be used in determining wafer drift. If the notch or flat is at the trailing edge of the wafer, the front edge of the wafer can be used in determining drift.

More preferably, the wafers are arranged such that neither the notch nor flat interferes with either the front or trailing edge when properly oriented. If the notch or flat does interfere with calculation, then the wafer is misoriented. The wafer is therefore preferably returned to the cassette from which it came and is not further processed.

The device can also determine that the wafer is misoriented; for example, a misoriented flat or notch may have been sensed. According to the SEMI standards, wafers normally have one flat or notch. As noted in the previous paragraph, it is preferable to arrange the system such that the flat or notch does not interfere with the operation of the sensors at either the leading edge or the trailing edge of the wafer, when properly oriented. However, because of the variations in position within the cassette which were described above, in some cases the flat or notch may be present in the sensor path.

If both leading edge and trailing edge data are collected, the measured drifts at both edges can be compared. The calculated drift should at least approximately coincide. However, if the wafer a flat or notch was present at one of the sensors at the leading or trailing edge, $(x_1, y_1)$ and $(x_2, y_2)$ will be considerably different. Thus, if the difference between $(x_1, y_1)$ and $(x_2, y_2)$ is within a specified range (for example, less than about 0.5 mm) then no flat or notch was sensed. On the other hand, if the difference between $(x_1, y_1)$ and $(x_2, Y_2)$ is not within the specified range (in the present embodiment, greater than about 0.5 mm), then a flat or notch has been sensed at either the leading or trailing edge, and the wafer is removed to the original cassette and not further processed.

It will be appreciated by those skilled in the art that various omissions, additions and modifications may be made to the processes described above without departing from the scope of the invention, and all such modifications and changes are intended to fall within the scope of the invention, as defined by the appended claims.

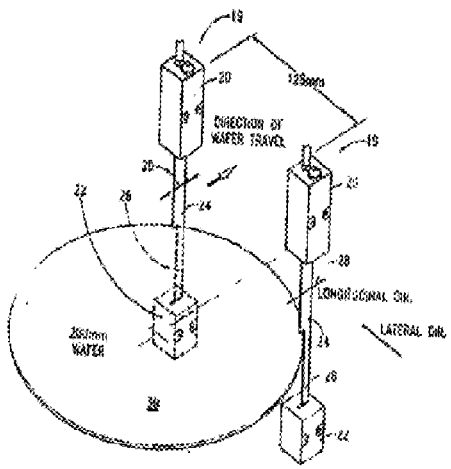
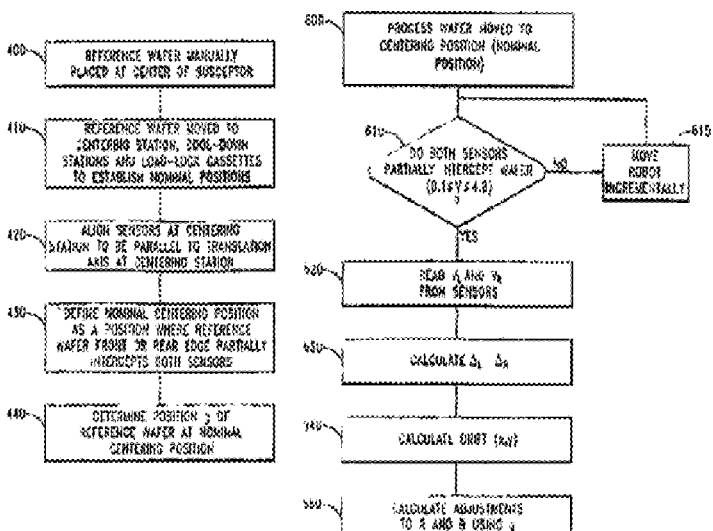

I claim:

1. A method of accurately positioning a substrate within a semiconductor processing apparatus, the method comprising:

loading a reference substrate onto a robot;

moving the robot with the reference substrate to a nominal robot position at a positioning station;

recording reference substrate data from a sensor at the positioning station while the robot is at the nominal robot position;

loading a process substrate onto the robot;

moving the robot with the process substrate to the nominal robot position at the positioning station;

recording process substrate data from the sensor at the positioning relating to the process substrate at the positioning station;

calculating a substrate drift of the process substrate relative to the reference substrate; and compensating for the substrate drift in subsequent robot movement of the process substrate.

2. The method of claim 1, wherein the sensor comprises a proportionate sensor providing an output value proportionate to a portion of a sensor beam unblocked by the substrate.

3. The method of claim 2, wherein the positioning station comprises at least two proportionate sensors, the reference substrate data and process substrate data including output from each of the at least two proportionate sensors.

4. The method of claim 3, wherein moving the robot with the reference substrate to the nominal robot position comprises conducting an iterative process until each of the at least two proportionate sensors are partially blocked by an edge of the reference substrate.

5. The method of claim 3, further comprising, after moving the robot with the process substrate to the nominal robot position, an iterative robot movement process if necessary until each of the at least two proportionate sensors are partially blocked by an edge of the reference substrate.

6. The method of claim 5, further comprising compensating for the iterative robot movement process while compensating for the substrate drift.

7. The method of claim 3, wherein each of the at least two proportionate sensors are partially blocked by a trailing edge of the process substrate when the process substrate data is recorded.

8. The method of claim 3, wherein each of the at least two proportionate sensors are partially blocked by a leading edge of the process substrate when the process substrate data is recorded.

9. The method of claim 8, further comprising recording additional process substrate data when each of the at least two proportionate sensors are partially blocked by a trailing edge of the process substrate.

10. The method of claim 9, wherein each of the at least two proportionate sensors are partially blocked by a leading edge of the reference substrate at a second nominal robot position when the reference substrate data is recorded, and further comprising recording additional reference substrate data when each of the at least two proportionate sensors are partially blocked by a trailing edge of the reference substrate.

11. The method of claim 9, further comprising comparing a substrate drift calculated with the process substrate data against a substrate drift calculated with the additional process substrate data to determine presence of a substrate notch/flat at either of the leading or trailing edges.

12. The method of claim 9, comprising:
   calculating first drift parameters from the process substrate data recorded while the leading edge of the process substrate partially blocks each of the at least two proportionate sensors; and
   calculating second drift parameters using the additional process substrate data recorded while the trailing edge of the process substrate partially blocks each of the at least two proportionate sensors.

13. The method of claim 12, further comprising determining presence of a substrate notch/flat at either of the leading or trailing edges by determining whether a difference in the first drift parameters and the second drift parameters is above an allowable threshold.

14. The method of claim 13, wherein the allowable threshold value is about 0.5 mm.

15. The method of claim 12, wherein calculating the substrate drift comprises averaging the first drift parameters and the second drift parameters.

16. The method of claim 3, wherein calculating the substrate drift comprises calculating drift parameters (x, y) representing lateral and longitudinal drift of the process substrate relative to the reference substrate.

17. The method of claim 16, wherein calculating drift parameters (x, y) of the process substrate from the nominal substrate position comprises
   calculating linear deviation $\Delta$ of an interception point of the process substrate edge relative to the reference substrate interception point for each of the at least two proportionate sensors;
   calculating a lateral spacing $f$ of each sensor from an axis of robot translation; and
   calculating the drift parameters (x, y) from the linear deviations $\Delta$, $f$ and the substrate diameter d.

18. The method of claim 17, wherein the lateral spacing $f$ of each sensor is calculated using the following formula
$$f = \frac{1}{2}\sqrt{d^2 - (p_i - p_i')^2}$$
wherein $(p_1-p_1')$ is equal to a distance the substrate has moved along a direction parallel to the sensor longitude between a position in which a leading edge of the substrate intercepts the sensor and a position in which a trailing edge of the substrate intercepts the sensor at the same point.

19. The method of claim 17, wherein, for each sensor,
$$\Delta = \frac{l_{max} - l_{min}}{V_{max} - V_{min}}(V_{ref} - V)$$
where $I_{max}$ and $I_{min}$ represent maximum and minimum sensor lengths blocked by the substrate, $V_{max}$ and $V_{min}$ represent the output value of the sensors when $I_{max}$ and $I_{min}$ are blocked, $V_{ref}$ indicates the sensor output value when the substrate is at the nominal position, and V indicates the sensor output value when the process substrate is at the nominal substrate position.

20. The method of claim 19, wherein (x, y) are calculated using the following formulae:

$$x = \frac{1}{2}\left[f_L - f_R + \sqrt{\left(\frac{d}{s}\right)^2 - 1}\left(\Delta_L - \Delta_R + \sqrt{\left(\frac{d}{2}\right)^2 - f_L^2} - \sqrt{\left(\frac{d}{2}\right)^2 - f_R^2}\right)\right]$$

$$y = \frac{1}{2}\left[-\sqrt{\left(\frac{d}{s}\right)^2 - 1}(f_L + f_R) + \right.$$
$$\left.\left(\Delta_L + \Delta_R + \sqrt{\left(\frac{d}{2}\right)^2 - f_L^2} + \sqrt{\left(\frac{d}{2}\right)^2 - f_R^2}\right)\right]$$

$$s^2 = (f_L + f_R)^2 + \left(\Delta_L - \Delta_R + \sqrt{\left(\frac{d}{2}\right)^2 - f_L^2} - \sqrt{\left(\frac{d}{2}\right)^2 - f_R^2}\right)^2$$

wherein d represents the substrate diameter, $\Delta_L$ and $\Delta_R$ are the substrate deviations of the two sensors, and $f_L$ and $f_R$ are the lateral spacing from left and right sensors, respectively to an axis of robot translation.

21. The method of claim 20, further comprising determining the nominal robot position by:
   moving the robot with the reference substrate to the nominal robot position;
   rotating the reference substrate through an angle $\theta$;
   calculating an $x_g$ displacement resulting from rotating through the angle $\theta_x$ using the formula for x in claim 20; and
   obtaining a value g by substituting the value of $x_g$ obtained into the following formula:

$$g = \frac{x_g}{\sin\theta_g}.$$

22. The method of claim 21, wherein compensating for substrate drift comprises changing the position of the robot supporting the process substrate in a accordance with the following formulae:

$$\Delta\theta = \sin^{-1}\left(\frac{-x}{\sqrt{x^2 + (g+\delta+y)^2}}\right)$$

$$\Delta R = g + \delta - \sqrt{x^2 + (g+\delta+y)^2}$$

where $\Delta R$ indicates a compensating change along the translation axis $\Delta\theta$ indicates a compensating change in rotational position, g is calculated from the formula of claim 21, (x, y) are calculated from the formulae of claim 20 and $\delta$ represents a change in robot position from the positioning station g when compensation is made.

23. The method of claim 1, further comprising determining the nominal robot position for use in compensating for the substrate drift by intentionally inducing a drift, measuring the induced drift and calculating reference substrate position based upon the measured induced drift.

24. A system for accurately positioning a workpiece during movement thereof, the system comprising:
   a positioning station comprising at least two proportionate sensors aligned parallel to one another, each sensor producing an output inversely proportional to a sensor beam area blocked by the workpiece; and
   a computer instructing a robot to move the workpiece into a position at the positioning station wherein at least two of the sensors have their sensor beams partially blocked by an edge of the workpiece, the computer programmed to read outputs from the sensors,
  calculate a positional drift relative to an expected workpiece position, and
  adjust a robot position to compensate for the positional drift.

25. A method of orienting at least one sensor for determining a position of a substrate, comprising:
  placing a sensor within a processing system in an initial orientation;
  moving the substrate to a plurality of substrate positions;
  collecting data from the sensor at the plurality of substrate positions; and
  adjusting the sensor from the initial orientation based upon the data collected by the sensor.

26. The method of claim 25, wherein moving the substrate comprises moving the substrate exclusively in a single direction of translation among the plurality of substrate positions.

27. The method of claim 26, wherein moving the substrate comprises translating the substrate upon a robot end effector.

28. The method of claim 26, wherein adjusting the sensor from the initial orientation comprises aligning the sensor to have an axis parallel to the direction of translation.

29. The method of claim 28, further comprising aligning a second sensor to have an axis parallel to the direction of translation, thereby aligning the sensor with the second sensor.

30. The method of claim 25, wherein the sensor comprises a proportionate sensor providing output proportionate to an area of a sensor beam unblocked by the substrate.

31. The method of claim 30, wherein moving the substrate to a plurality of substrate positions comprises:
  in a first iteration, moving the substrate to a first position wherein a front edge of the substrate blocks a back portion of the sensor beam and moving the substrate along a direction of translation to a second position wherein a trailing edge of the substrate blocks a front portion of the sensor beam, the back portion and the front portion equaling a total area of the sensor beam;
  in at least a second iteration, moving the substrate along the direction of translation to a different set of first and second positions wherein the back portion and the front portion equal the total area of the sensor beam.

32. The method of claim 31, wherein adjusting the sensor comprises orienting the sensor such that data collected from the sensor indicates a value that is equal for each iteration.

33. The method of claim 31, wherein adjusting the sensor comprises calculating, for each iteration, a value proportionate to an orthogonal distance from an axis of the direction of substrate translation to a point of the sensor bordering the front portion and back portion.

34. The method of claim 33, wherein adjusting the sensor comprises rotating the sensor such that the value is equal for each iteration.

35. A method of orienting a sensor beam to have a longitudinal direction of the beam parallel to a translation direction of a substrate positioning device, the method comprising:
  (a) determining a general translation direction of a robot end effector, to which the substrate is attached for transport;
  (b) installing a sensor system comprising a transmitter, which produces the sensor beam with a cross-section length and thickness, wherein the length is substantially larger than the thickness and having a direction along the length that is defined as a longitudinal direction, and a receiver which measures a maximum analog voltage, $v_{max}$, when a full intensity of the sensor beam reaches the receiver and also measures a linearly decreasing voltage as the sensor beam is increasingly blocked by the substrate and smaller portions of the sensor beam reach the receiver;
  (c) placing the substrate onto the end effector,
  (d) moving the substrate to a centering station at a position $p_i$ where the sensor beam is blocked, in part, by a leading edge of the substrate, and the receiver indicates a voltage, $v_1^-$,
  (e) moving the substrate to a position $p_i'$ along the translation direction where the sensor beam is blocked, in part, by a trailing edge of the substrate and the receiver indicates a voltage of $v_i'$, such that $v_i' = v_{max} - v_i$;
  (f) repeating steps (d) and (e) for at least i={1, 2};
  (g) calculating a value $f_i$ for all i, where $f_i$ is a function of a distance moved between positions $p_i$ and $p_i'$; and
  (h) rotating the sensor system $f_i$ is not constant within a predetermined tolerance for all i and repeating steps (d)–(h).

36. The method of claim 35, wherein the substrate is a circular semiconductor wafer.

37. The method of claim 36, wherein $f_i$ is proportional to a lateral distance between two parallel sensors of the sensor system.

38. The method of claim 37, wherein $$f_i = \frac{1}{2}\sqrt{d^2 - (p_i - p_i')^2}$$

where d is a diameter of the wafer and ($p_i - p_i'$) is the distance moved between positions $p_i$ and $p'_i$.

39. The method of claim 35, wherein the sensor beam has a length of about 10 mm and a thickness of about 1 mm.

40. The method of claim 35, wherein the receiver maximum voltage, $v_{max}$ is about 5 volts.

41. The method of claim 35, wherein multiple sensor systems are installed and steps (c)–(h) are repeated for each sensor system until all sensor systems have their longitudinal axis parallel to the one another.

42. The method of claim 41, wherein the sensor systems are installed in step (b) with their longitudinal directions approximately parallel to the general translation direction.

43. The method of claim 35, wherein step (f) comprises repeating steps (d) and (e) for at least i={1, 2, 3, 4, 5}.

44. The method of claim 35, wherein the predetermined tolerance is ±0.05 mm.

45. The method of claim 44, wherein the predetermined tolerance is ±0.005 mm.

* * * * *

UNITED STATES PATENT AND TRADEMARK OFFICE
CERTIFICATE OF CORRECTION

| | | |
|---|---|---|
| PATENT NO. | : 7,008,802 B2 | Page 1 of 15 |
| APPLICATION NO. | : 09/870393 | |
| DATED | : March 7, 2006 | |
| INVENTOR(S) | : Zhimin Lu | |

It is certified that error appears in the above-identified patent and that said Letters Patent is hereby corrected as shown below:

The title page showing an illustrative figure(s) 6, 7 and 11 should be deleted and substitute therefore the attached title page consisting of Figs. 6, 7 and 11.

The drawing sheets consisting of Fig(s) 1-12 should be deleted and substitute therefore the attached drawing sheets consisting of Fig(s) 1-12.

On page 1 of the Specification, in the Title, Delete "WATER" and insert --WAFER--, therefor.

In column 1, at line 2: Delete "WATER" and insert --WAFER--, therefor.

In column 8, at line 14: Delete "parameters" and insert --parameter $fi$ --, therefor.

In column 8, at line 16: Delete "$p_1$·" and insert --pi· --, therefor.

In column 10, at line 48: Delete "$\alpha_L$" and insert -- $\Delta_L$ --, therefor.

In column 10, at line 48: Delete "$\alpha_R$" and insert-- $\Delta_R$ --, therefor.

In column 10, at line 51: Delete "maybe" and insert --may be--, therefor.

In column 15, at line 50, in Claim 18: Delete "($p_1$-$p_1$')" and insert --($p_i$-$p'_i$) --, therefor.

In column 15, at line 61, in Claim 19: Delete "$I_{max}$" and insert --$l_{max}$ --, therefor.

In column 15, at line 61, in Claim 19: Delete "$I_{min}$" and insert--$l_{min}$--, therefor, In column 15, at line 63, in Claim 19: Delete "$I_{max}$" and insert--$l_{max}$--, therefor.

In column 15, at line 63, in Claim 19: Delete "$I_{min}$" and insert--$l_{min}$--, therefor.

In column 16, at line 25, in Claim 21: Delete "Θ;" and insert --Θg;"--, therefor.

In column 16, at line 27, in Claim 21: Delete "$Θ_x$" and insert --Θg--, therefor.

In column 16, at line 37, in Claim 22: After "in" delete "a".

In column 16, at approximately line 47, in Claim 22: Delete "axis" and insert --axis,--, therefor.

In column 18, at line 12, in Claim 35: Delete "effector," and insert --effector;--, therefor.

UNITED STATES PATENT AND TRADEMARK OFFICE
CERTIFICATE OF CORRECTION

PATENT NO. : 7,008,802 B2
APPLICATION NO. : 09/870393
DATED : March 7, 2006
INVENTOR(S) : Zhimin Lu It is certified that error appears in the above-identified patent and that said Letters Patent is hereby corrected as shown below:

In column 18, at line 16, in Claim 35: Delete "$v_1^-$," and insert --$vi$ ;--, therefor.

In column 18, at line 21, in Claim 35: Delete "(c)" and insert --(e)--, therefor.

In column 18, at line 25, in Claim 35: After "system" insert --if--.

Signed and Sealed this

Sixteenth Day of January, 2007

JON W. DUDAS
*Director of the United States Patent and Trademark Office*

(12) United States Patent
Lu

(10) Patent No.: US 7,008,802 B2
(45) Date of Patent: Mar. 7, 2006

(54) METHOD AND APPARATUS TO CORRECT WAFER DRIFT

(75) Inventor: Zhimin Lu, Mesa, AZ (US)

(73) Assignee: ASM America, Inc., Phoenix, AZ (US)

(*) Notice: Subject to any disclaimer, the term of this patent is extended or adjusted under 35 U.S.C. 154(b) by 786 days.

(21) Appl. No.: 09/870,393

(22) Filed: May 29, 2001

(65) Prior Publication Data

US 2004/0151574 A1 Aug. 5, 2004

(51) Int. Cl.
  H01L 21/00 (2006.01)
  B65H 1/00 (2006.01)
  G01B 11/00 (2006.01)
  G01C 25/00 (2006.01)

(52) U.S. Cl. ........... 438/7; 414/936; 250/206.1; 356/622; 702/150

(58) Field of Classification Search .......... 438/5, 438/7, 14, 16; 250/252.1, 206, 206.1, 206.2, 250/578.1, 234–236; 700/121; 702/87, 94–95, 702/150; 414/816, 936; 356/614, 615, 623
See application file for complete search history.

(56) References Cited

U.S. PATENT DOCUMENTS

| 3,910,438 A | 9/1975 | Zanoni |
| 3,945,505 A | 3/1976 | Frosin et al. |
| 4,024,944 A | 5/1977 | Adams et al. |

(Continued)

FOREIGN PATENT DOCUMENTS

| EP | 0 282 233 A3 | 9/1988 |
| EP | 0 313 460 A2 | 4/1989 |
| EP | 0 597 637 A1 | 5/1994 |
| JP | 58-65270 | 4/1983 |
| JP | 61-087352 | 5/1986 |
| JP | 61-184842 | 8/1986 |
| JP | 61-228039 | 10/1986 |
| JP | 62-073643 | 4/1987 |
| JP | 11-347975 | 12/1999 |
| WO | WO 99/52686 | 10/1999 |

OTHER PUBLICATIONS

Kurt Petersen et al., "High-Performance Mass-Flow Sensor with Integrated Laminar Flow Micro-Channels," *International Conference on Solid State Sensors and Actuators—Digest of Technical Papers* (1985), pp. 361–363.
GCA Corporation, (Wafertrac1006 Advertisement), *Solid State Technology*, vol. 28, No. 1, (Jan. 1985), p. 3.
Brooks Automation, (Wafer Handling Robot), *Solid State Technology*, vol. 28, No. 1, (Jan. 1985), p. 74.
Zbigniew M. Wojcik, "A Method of Automatic Centering of Chips, Masks and Semiconductor Wafers," *Electron Technology*, (1977), vol. 10, No. 3, pp. 79–96.
IBM Technical Disclosure Bulletin, "Automatic Mask/Wafer Alignment System," (Sep. 1985), vol. 28, No. 4, pp. 1474–1479.
IBM Technical Disclosure Bulletin, "Vacuum-Compatible Low Contamination Wafer-Orientor System," (Feb. 1986), vol. 28, No. 9, pp. 4056–4058.

(Continued)

*Primary Examiner*—Evan Pert
(74) *Attorney, Agent, or Firm*—Knobbe, Martens, Olson & Bear, LLP

(57) ABSTRACT

A method and apparatus is provided for determining workpiece drift from its nominal or intended position. The apparatus includes two proportionate sensors, each of which gives an output reading that depends upon how much of the sensor beam is blocked by an edge of the workpiece. A computer can calculate positional drift based upon these readings. Also disclosed is a method for aligning proportionate sensors to be parallel to one another.

45 Claims, 12 Drawing Sheets

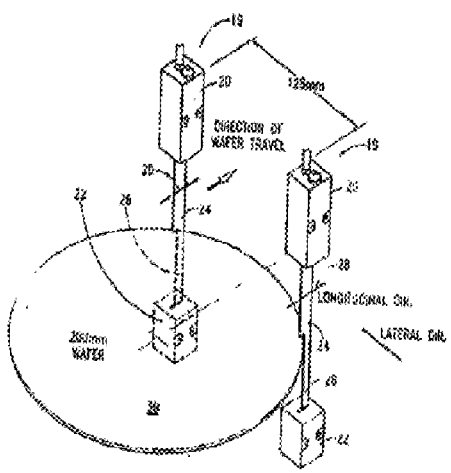
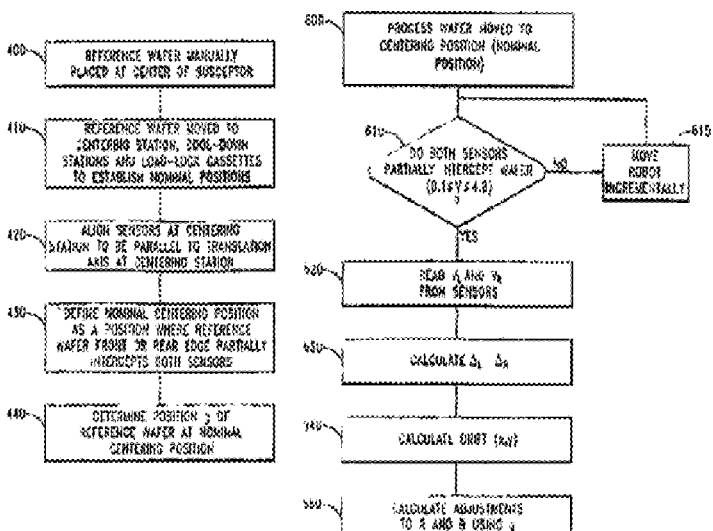

UNITED STATES PATENT AND TRADEMARK OFFICE
CERTIFICATE OF CORRECTION

| | | |
|---|---|---|
| PATENT NO. | : 7,008,802 B2 | Page 1 of 15 |
| APPLICATION NO. | : 09/870393 | |
| DATED | : March 7, 2006 | |
| INVENTOR(S) | : Zhimin Lu | |

It is certified that error appears in the above-identified patent and that said Letters Patent is hereby corrected as shown below:

The title page showing an illustrative figure(s) 6, 7 and 11 should be deleted and substitute therefore the attached title page consisting of Figs. 6, 7 and 11.

The drawing sheets consisting of Fig(s) 1-12 should be deleted and substitute therefore the attached drawing sheets consisting of Fig(s) 1-12.

On page 1 of the Specification, in the Title, Delete "WATER" and insert --WAFER--, therefor.

In column 1, at line 2: Delete "WATER" and insert --WAFER--, therefor.

In column 8, at line 14: Delete "parameters" and insert --parameter $fi$ --, therefor.

In column 8, at line 16: Delete "$p_1 \cdot$" and insert --$pi \cdot$ --, therefor.

In column 10, at line 48: Delete "$\alpha_L$" and insert -- $\Delta_L$ --, therefor.

In column 10, at line 48: Delete "$\alpha_R$" and insert-- $\Delta_R$ --, therefor.

In column 10, at line 51: Delete "maybe" and insert --may be--, therefor.

In column 15, at line 50, in Claim 18: Delete "$(p_1-p_1')$" and insert --$(p_i-p'_i)$ --, therefor.

In column 15, at line 61, in Claim 19: Delete "$I_{max}$" and insert --$l_{max}$ --, therefor.

In column 15, at line 61, in Claim 19: Delete "$I_{min}$" and insert--$l_{min}$--, therefor, In column 15, at line 63, in Claim 19: Delete "$I_{max}$" and insert--$l_{max}$--, therefor.

In column 15, at line 63, in Claim 19: Delete "$I_{min}$" and insert--$l_{min}$--, therefor.

In column 16, at line 25, in Claim 21: Delete "Θ;" and insert --Θg;"--, therefor.

In column 16, at line 27, in Claim 21: Delete "$Θ_x$" and insert --Θg--, therefor.

In column 16, at line 37, in Claim 22: After "in" delete "a".

In column 16, at approximately line 47, in Claim 22: Delete "axis" and insert --axis,--, therefor.

In column 18, at line 12, in Claim 35: Delete "effector," and insert --effector;--, therefor.

UNITED STATES PATENT AND TRADEMARK OFFICE
CERTIFICATE OF CORRECTION

PATENT NO. : 7,008,802 B2
APPLICATION NO. : 09/870393
DATED : March 7, 2006
INVENTOR(S) : Zhimin Lu It is certified that error appears in the above-identified patent and that said Letters Patent is hereby corrected as shown below:

In column 18, at line 16, in Claim 35: Delete "$v_1^-$," and insert --$vi$ ;--, therefor.

In column 18, at line 21, in Claim 35: Delete "(c)" and insert --(e)--, therefor.

In column 18, at line 25, in Claim 35: After "system" insert --if--.

This certificate supersedes Certificate of Correction issued January 16, 2007.

Signed and Sealed this

Sixth Day of February, 2007

JON W. DUDAS
*Director of the United States Patent and Trademark Office*

United States Patent
Lu

(10) Patent No.: US 7,008,802 B2
(45) Date of Patent: Mar. 7, 2006

(54) METHOD AND APPARATUS TO CORRECT WATER DRIFT

(75) Inventor: Zhimin Lu, Mesa, AZ (US)

(73) Assignee: ASM America, Inc., Phoenix, AZ (US)

(*) Notice: Subject to any disclaimer, the term of this patent is extended or adjusted under 35 U.S.C. 154(b) by 786 days.

(21) Appl. No.: 09/870,393

(22) Filed: May 29, 2001

(65) Prior Publication Data
US 2004/0151574 A1 Aug. 5, 2004

(51) Int. Cl.
H01L 21/00 (2006.01)
B65H 1/00 (2006.01)
G01B 11/00 (2006.01)
G01C 25/00 (2006.01)

(52) U.S. Cl. ............ 438/7; 414/936; 250/206.1; 356/622; 702/150

(58) Field of Classification Search ........ 438/5, 438/7, 14, 16; 250/252.1, 206, 206.1, 206.2, 250/578.1, 234–236; 700/121; 702/87, 94–95, 702/150; 414/816, 936; 356/614, 615, 623
See application file for complete search history.

(56) References Cited

U.S. PATENT DOCUMENTS
3,910,438 A 9/1975 Zasoen
3,945,505 A 3/1976 Froshe et al.
4,024,944 A 5/1977 Adams et al.
(Continued)

FOREIGN PATENT DOCUMENTS
| EP | 0 282 233 A3 | 9/1988 |
| EP | 0 313 460 A2 | 4/1989 |
| EP | 0 597 637 A1 | 5/1994 |
| JP | 58-055270 | 4/1983 |
| JP | 61-087352 | 5/1986 |
| JP | 61-186842 | 8/1986 |
| JP | 61-228039 | 10/1986 |
| JP | 62-073643 | 4/1987 |
| JP | 11-347975 | 12/1999 |
| WO | WO 99/52686 | 10/1999 |

OTHER PUBLICATIONS
Kurt Petersen et al., "High-Performance Mass-Flow Sensor with Integrated Laminar Flow Micro-Channels," *International Conference on Solid State Sensors and Actuators—Digest of Technical Papers* (1985), pp. 361-363.

GCA Corporation, (Wafertrac1006 Advertisement), *Solid State Technology*, vol. 28, No. 1, (Jan. 1985), p. 3.

Brooks Automation, (Wafer Handling Robot), *Solid State Technology*, vol. 28, No. 1, (Jan. 1985), p. 74.

Zbigniew M. Wojcik, "A Method of Automatic Centering of Chips, Masks and Semiconductor Wafers," *Electron Technology*, (1977), vol. 10, No. 3, pp. 79-96.

IBM Technical Disclosure Bulletin, "Automatic Mask/Wafer Alignment System," (Sep. 1985), vol. 28, No. 4, pp. 1474-1479.

IBM Technical Disclosure Bulletin, "Vacuum-Compatible Low Contamination Wafer-Orientor System," (Feb. 1986), vol. 28, No. 9, pp. 4056-4058.

(Continued)

*Primary Examiner*—Evan Pert
(74) *Attorney, Agent, or Firm*—Knobbe, Martens, Olson & Bear, LLP

(57) ABSTRACT

A method and apparatus is provided for determining workpiece drift from its nominal or intended position. The apparatus includes two proportionate sensors, each of which gives an output reading that depends upon how much of the sensor beam is blocked by an edge of the workpiece. A computer can calculate positional drift based upon these readings. Also disclosed is a method for aligning proportionate sensors to be parallel to one another.

45 Claims, 12 Drawing Sheets